United States Patent
Tashiro

(10) Patent No.: US 8,797,055 B2
(45) Date of Patent: Aug. 5, 2014

(54) PROBER AND METHOD OF INSPECTING SEMICONDUCTOR CHIP

(75) Inventor: Kazuhiro Tashiro, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 440 days.

(21) Appl. No.: 13/168,719

(22) Filed: Jun. 24, 2011

(65) Prior Publication Data

US 2011/0254574 A1 Oct. 20, 2011

Related U.S. Application Data

(63) Continuation of application No. PCT/JP2008/073707, filed on Dec. 26, 2008.

(51) Int. Cl.
*G01R 31/308* (2006.01)
*G01R 31/00* (2006.01)
*G01R 31/26* (2014.01)
*G01N 21/00* (2006.01)
*G01R 31/28* (2006.01)

(52) U.S. Cl.
CPC ........ *G01R 31/2887* (2013.01); *G01R 31/2891* (2013.01)
USPC ............ 324/750.23; 324/756.03; 324/762.01; 356/237.1

(58) Field of Classification Search
None
See application file for complete search history.

(56) References Cited

U.S. PATENT DOCUMENTS

| 5,644,245 A | 7/1997 | Saitoh et al. | |
|---|---|---|---|
| 7,224,175 B2 * | 5/2007 | Chaya et al. | 324/754.1 |
| 2006/0139628 A1 * | 6/2006 | Chaya et al. | 356/237.1 |
| 2008/0238463 A1 * | 10/2008 | Takabe et al. | 324/758 |
| 2011/0018564 A1 * | 1/2011 | Washio et al. | 324/750.16 |

FOREIGN PATENT DOCUMENTS

| JP | 59-005641 A | 1/1984 |
|---|---|---|
| JP | 60-024030 A | 2/1985 |
| JP | 7-013990 B2 | 2/1995 |
| JP | 7-147304 A | 6/1995 |
| JP | 2003-068813 A | 3/2003 |
| JP | 2007-095766 A | 4/2007 |
| JP | 2008-108930 A | 5/2008 |

OTHER PUBLICATIONS

English translation of JP 2007-095766.*
English translation of JP 2003-068813.*
International Search Report of PCT/JP2008/073707, mailing date Apr. 7, 2009.

* cited by examiner

*Primary Examiner* — Jermele M Hollington
(74) *Attorney, Agent, or Firm* — Westerman, Hattori, Daniels & Adrian, LLP

(57) ABSTRACT

A prober includes a probe card provided with a support board and a probe attached to the support board, a stage on which a measurement wafer is mounted, a camera provided over the probe card to observe an electrode pad of a first semiconductor chip formed on the measurement wafer, and a stage moving unit for moving the position of the stage relative to the probe card.

7 Claims, 22 Drawing Sheets

FIG. 12
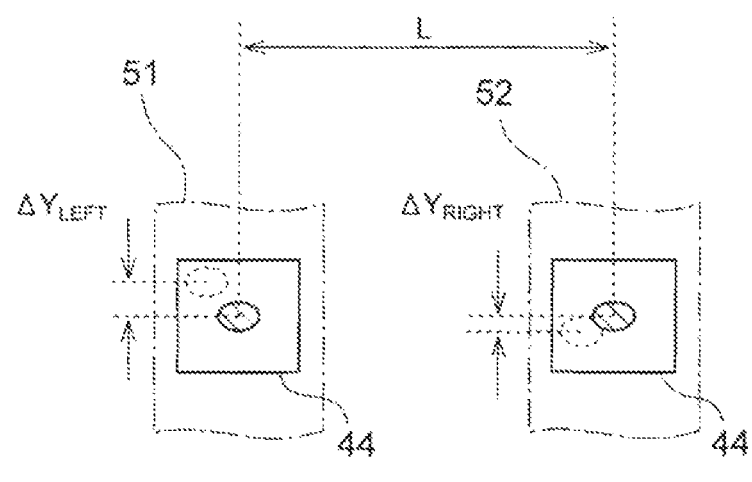
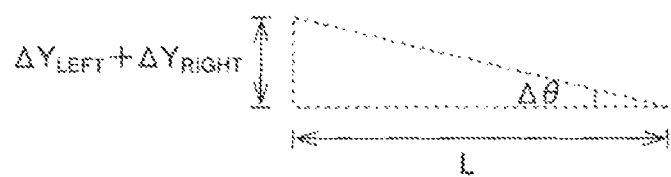

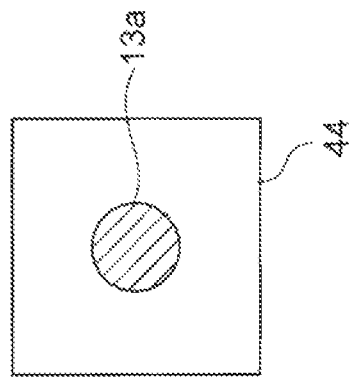
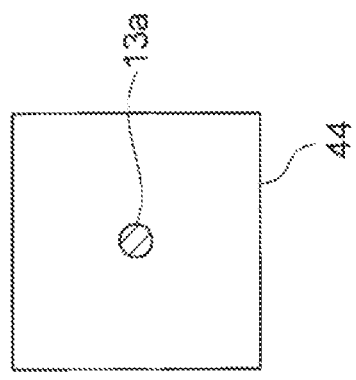

PROBER AND METHOD OF INSPECTING SEMICONDUCTOR CHIP

CROSS-REFERENCE TO RELATED APPLICATIONS

This application is a continuation of prior International Patent Application No. PCT/JP2008/073707, filed on Dec. 26, 2008, the entire contents of which are incorporated herein by reference.

FIELD

The embodiments discussed herein are related to a prober, a testing apparatus, and a method of inspecting a semiconductor chip.

BACKGROUND

In the fabricating process for semiconductor devices such as LSIs, after circuits are formed on a wafer, electrical testing is conducted to check whether or not the circuits perform predetermined operations.

In this test, for example, to check whether or not circuits operate in the guaranteed temperature range of the product, the wafer is mounted on a heated or cooled stage, and a probe of a testing apparatus is brought into contact with integrated semiconductor chips formed on the wafer.

To conduct the test normally, it is necessary that the probe is brought precisely into contact with electrode pads of the semiconductor chips.

However, when the stage is heated or cooled as described above, the radiant heat from the stage may deform the probe and cause a tip of the probe to miss the electrode pad. In that case, the tip of the probe comes into contact with a passivation film around the electrode pad, and a probe mark is left on the passivation film. In the worst case, a crack may be generated in the passivation film, and bring about a problem such as leakage between power supplies in the semiconductor device.

Particularly, as for a semiconductor device such as a system LSI whose external connection terminals have significantly reduced size and pitch, the probe displacement as described above is likely to occur, and thus the improvement is demanded.

As a method of preventing such probe displacement, for example, there is a method in which a probe is observed from under the probe card with a camera every time a test on a predetermined number of chips is completed. In this case, the position of the probe tip is identified by the observation with the camera, and a stage is moved in a direction such that the displacement can be offset.

However, this method requires the stage to be temporarily withdrawn from the prober to identify the probe with the camera. This requires extra time for the withdrawal. Moreover, this causes another problem such that the probe is naturally cooled and in turn deformed while the stage is withdrawn from the prober, and the deformation hinders precise identification of the position of the probe tip.

Furthermore, with this method, it cannot be checked during the test whether or not a probe mark has been left on a passivation film by the displacement between the probe and the electrode pad. For this reason, the probe mark is finally found in the visual inspection process after the test. In the case that the position of the stage is not precisely corrected in such a situation, a series of multiple chips suffer defect caused by the probe mark. In the worst scenario, all the chips on a single wafer may be defected.

There is also another method in which a stage is temporarily withdrawn from a probe card to allow positioning between a probe and an electrode pad, and a probe mark on the electrode pad made by the contact between the electrode pad and the probe is identified.

Nevertheless, since this method also involves the withdrawing of the stage, the deformation of the probe due to natural cooling and a longer testing period for the withdrawal are inevitable. Further, this method merely judges whether a probe mark is left on the electrode pad or the probe misses the electrode pad. The method cannot go beyond the mere positioning such that the probe has only to contact the electrode pad anywhere, and thus it is difficult to perform highly accurate positioning between the electrode pad and the probe.

Meanwhile, there is still another method as follows. Specifically, the position of a probe mark left on an electrode pad is identified with a camera. If it is found out that the probe mark protrudes outside the electrode pad, an alarm is turned on to stop the measurement, or to urge re-positioning between the probe and the electrode pad.

However, in this method, when the probe mark is to be identified with the camera, a stage has to be conveyed to a position where there is the camera. Thereby, extra time for the conveyance is required, and the probe is naturally cooled and in turn deformed during the conveyance. Hence, the aforementioned problems cannot be solved yet.

Note that the related techniques are disclosed in Japanese Laid-open Patent Publications No. 60-24030, No. 59-5641, No. 07-13990, No. 07-147304, and No. 2008-108930.

SUMMARY

According to an aspect of the disclosure, a prober includes a probe card provided with a support board and a probe attached to the support board, a stage on which a measurement wafer is mounted, a camera provided over the probe card to observe an electrode pad of a first semiconductor chip formed on the measurement wafer, and moving units for moving a position of the stage relative to the probe card.

Moreover, according to another aspect of the disclosure, a testing apparatus includes a tester unit, and a prober unit electrically connected to the tester unit. The prober unit includes a probe card provided with a support board and a probe attached to the support board, a stage on which a measurement wafer is mounted, a camera provided over the probe card to observe an electrode pad of a semiconductor chip formed on the measurement wafer, and moving units for moving a position of the stage relative to the probe card.

Furthermore, according to still another aspect of the disclosure, a method for inspecting a semiconductor chip includes bringing a probe attached to a support board of a probe card into contact with an electrode pad of the first semiconductor chip formed on a measurement wafer on a stage, and measuring electrical characteristics of a first semiconductor chip. Before or after the first semiconductor chip is measured, the electrode pad of the first semiconductor chip is observed with a camera provided over the support board or above the probe card.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a schematic plan view illustrating a method of calculating a correction amount of a stage by rotation in the third embodiment;

FIG. 15A is an enlarged plan view of an electrode pad before the height position of a stage is corrected in the fourth embodiment, and FIG. 15B is an enlarged plan view of the electrode pad after the correction;

DESCRIPTION OF EMBODIMENTS

First Embodiment

Figure 1:
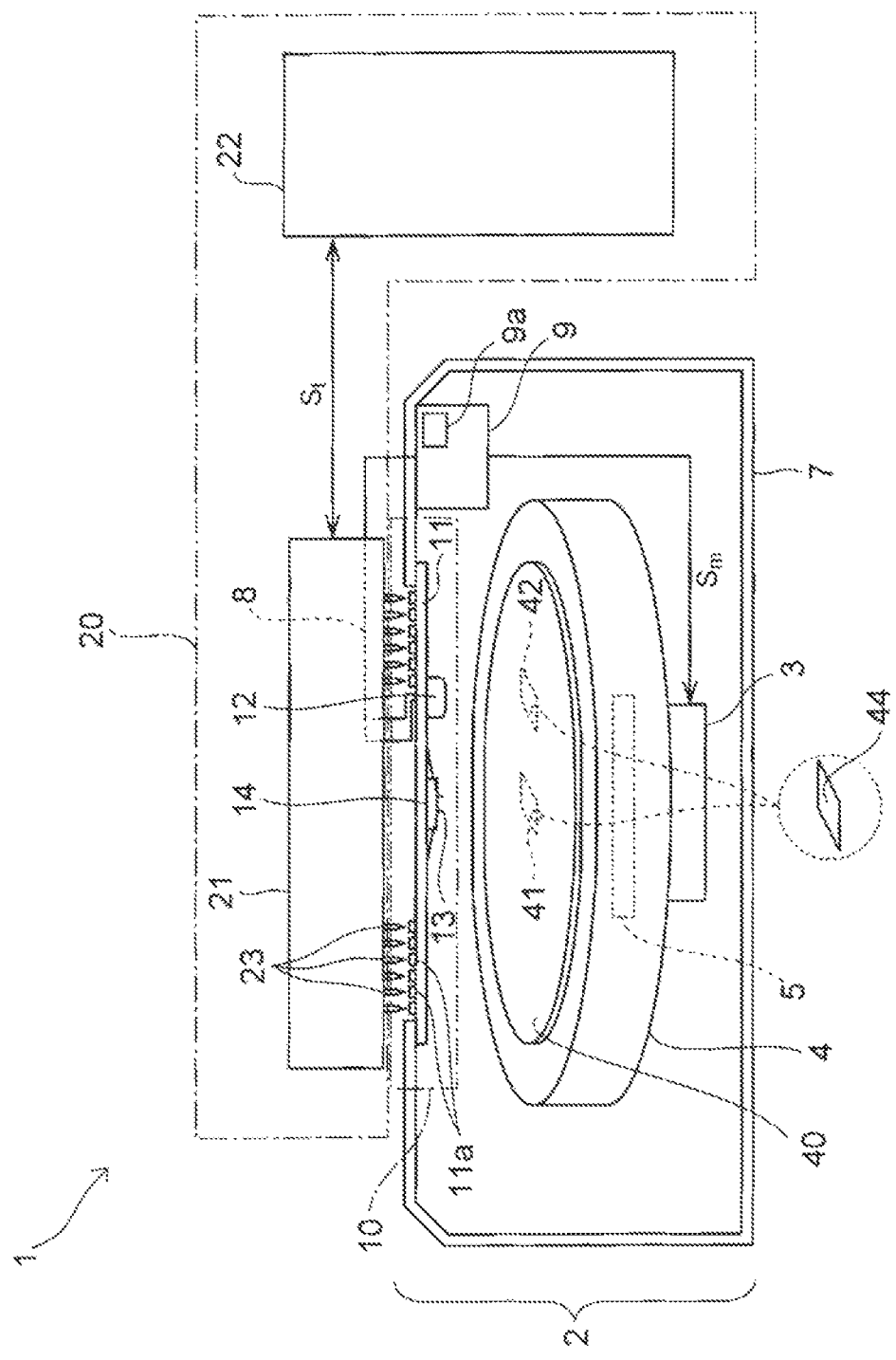
FIG. 1 is a configuration diagram of a testing apparatus according to a first embodiment.

FIG. 1 is a configuration diagram of a testing apparatus according to this embodiment.

The testing apparatus 1 has a prober 2 and a tester 20.

Among them, the prober 2 includes, in a case 7, a stage 4 on which a wafer 40 to be subjected to measurement (hereinafter, referred to as a measurement wafer) is mounted, and a stage moving unit 3 for translating or rotating the stage 4 in a horizontal plane. Note that the stage moving unit 3 also has a function of elevating and lowering the stage 4 in a vertical direction.

The stage 4 is elevated and lowered or moved in the horizontal plane by an unillustrated stepping motor provided to the stage moving unit 3. An amount of elevating, lowering or moving is controlled by a stage driving signal $S_m$ outputted from a controller 9.

Moreover, the stage 4 has a temperature adjusting unit 5 built therein to heat or cool the measurement wafer 40 to a predetermined temperature. To heat the measurement wafer 40, for example, a heater of a resistive heating type (hereinafter, referred to as a resistive heater) may be provided as the temperature adjusting unit 5. Meanwhile, to cool the measurement wafer 40, a coolant pipe through which a coolant such as water flows may be provided as the temperature adjusting unit 5.

Further, a probe card 10 is provided above the stage 4 and faces the measurement wafer 40.

The probe card 10 is equipped with a resin-made support board 11 having a peripheral portion fixed to the case 7. Multiple probes 13 are attached to the support board 11. Each of the probes 13 is formed of, for example, a thin metal wire such as tungsten, and the interval between the probes 13 is secured by a glass-epoxy resin layer 14.

In addition, on a main surface of the support board 11 facing the measurement wafer 40, a camera 12 is provided to observe the measurement wafer 40. An image signal obtained by the camera 12 is taken in by the controller 9 through a cable 8. Additionally, the controller 9 is equipped with a storage 9a such as a hard disk or random access memory (RAM).

Meanwhile, the tester 20 has a test head 21 and a test unit 22.

The test unit 22 is electrically connected to the test head 21, and transfers a test signal $S_t$ between the test unit 22 and the test head 21.

The test head 21 is attached to the case 7 of the prober 2 in an openable and closable manner, and includes conductive pins 23 which come into contact with electrode pads 11a provided on the support board 11. When the measurement wafer 40 is inspected, the test signal $S_t$ is supplied from the conductive pins 21 to the probe 13 through the electrode pads 11a.

In the inspection, the stage 4 is driven in the horizontal plane in a manner such that the probe 13 is positioned above a first semiconductor chip 41 formed on the measurement wafer 40. Then, the stage 4 is elevated to thereby bring the prober 13 into contact with an electrode pad 44 of the first semiconductor chip 41, and the test signal $S_t$ is supplied from the prober 13 to the first semiconductor chip 41.

When the probe 13 is positioned above the first semiconductor chip 41 in this manner, the camera 12 is positioned above a different second semiconductor chip 42 from the first semiconductor chip 41, so that an electrode pad 44 of the second semiconductor chip 42 can be observed.

While the magnification of the camera 12 is not particularly limited, from the viewpoint of observing the state of the electrode pad 44 in detail, the magnification is preferably set to the extent that only one of multiple electrode pads 44 formed on the semiconductor chip 42 is captured within the field of view (hereinafter, FOV).

Note that the configuration of this embodiment is not limited to what is previously described. The position where the camera 12 is attached may be modified to a configuration as illustrated in FIG. 2.

Figure 2:
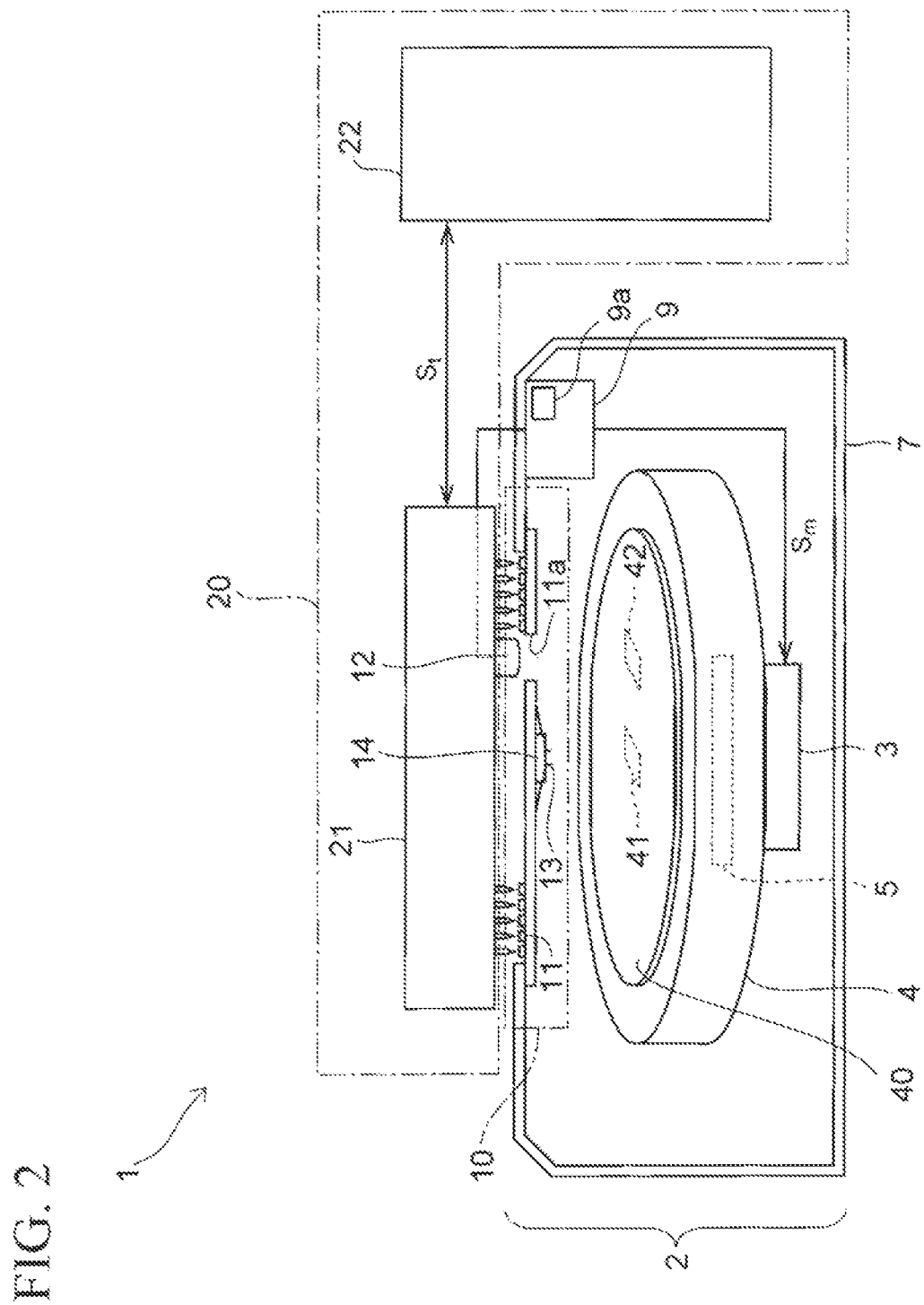
FIG. 2 is a configuration diagram of a testing apparatus according to a modified example of the first embodiment.

FIG. 2 is a configuration diagram a testing apparatus according to a modified example of the first embodiment. Note that, in FIG. 2, the same components as those in FIG. 1 are denoted by the same reference numerals as in FIG. 1, and description thereof is omitted below.

In an example illustrated in FIG. 2, the camera 12 is provided on the test head 21, and an opening 11a in the support board 11 is formed at a position corresponding to the camera 12. With such a configuration, the measurement wafer 40 is observed with the camera 12 through the opening 11a.

Figure 3:
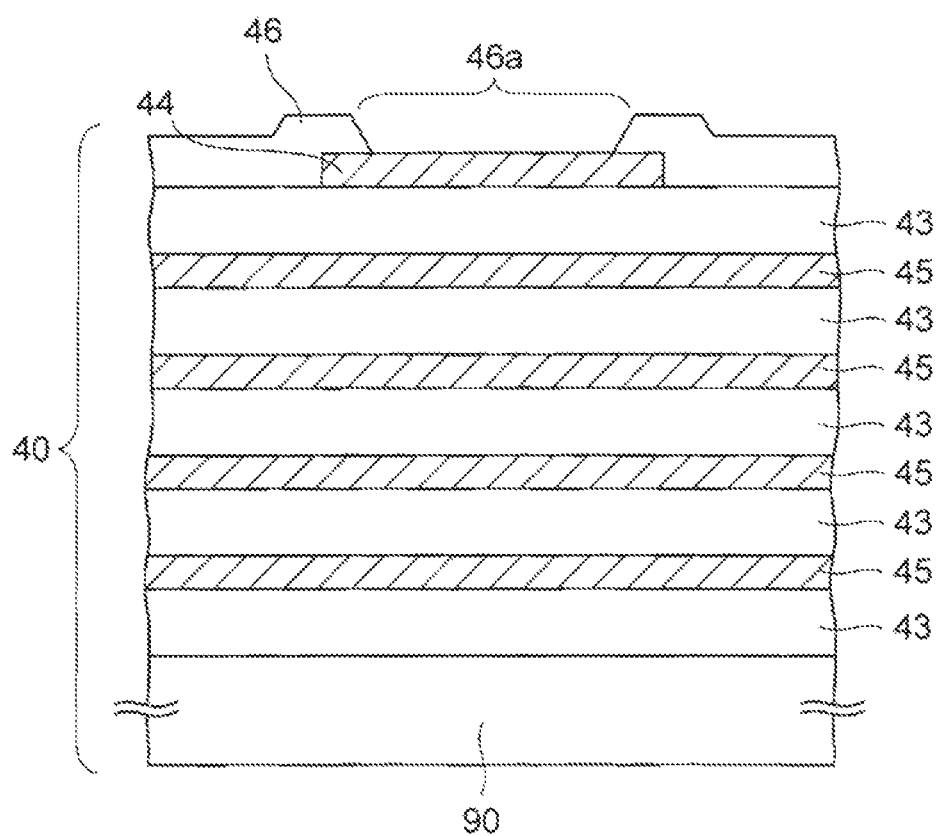
FIG. 3 is a sectional view of a measurement wafer.

FIG. 3 is a sectional view of the measurement wafer 40.

The measurement wafer 40 has a multilayer wiring structure in which interlayer insulating films 43 such as a silicon oxide film and metal wirings 45 such as an aluminum wiring are alternately stacked one another on a silicon substrate 90. While the thicknesses of these films and wirings are not particularly limited, these thicknesses are preferably approximately 100 to 1000 nm for the interlayer insulating film 43, and approximately 100 to 2000 nm for the metal wiring 45.

Moreover, on the uppermost interlayer insulating film 43, the electrode pad 44 and a passivation film 46 are formed. The electrode pad 44 is formed by patterning a metal film such as an aluminum film, and has a thickness of approximately 0.4 to 2 μm. The passivation film 46 is formed of a silicon nitride film or a polyimide film, and has a thickness of, for example, approximately 1 to 2 μm. And the passivation film 46 is equipped with an opening 46a in which the surface of the electrode pad 44 is exposed.

the electrode pad 44 has a rectangular planar shape, and multiple electrode pads 44 are arranged on one chip at a pitch of approximately 40 to 50 μm.

Next, a method of inspecting a semiconductor chip using the testing apparatus 1 is described. Note that the inspection method may employ any one of the testing apparatuses 1 illustrated in FIGS. 1 and 2. This is the same in each embodiment described later.

Figure 4:
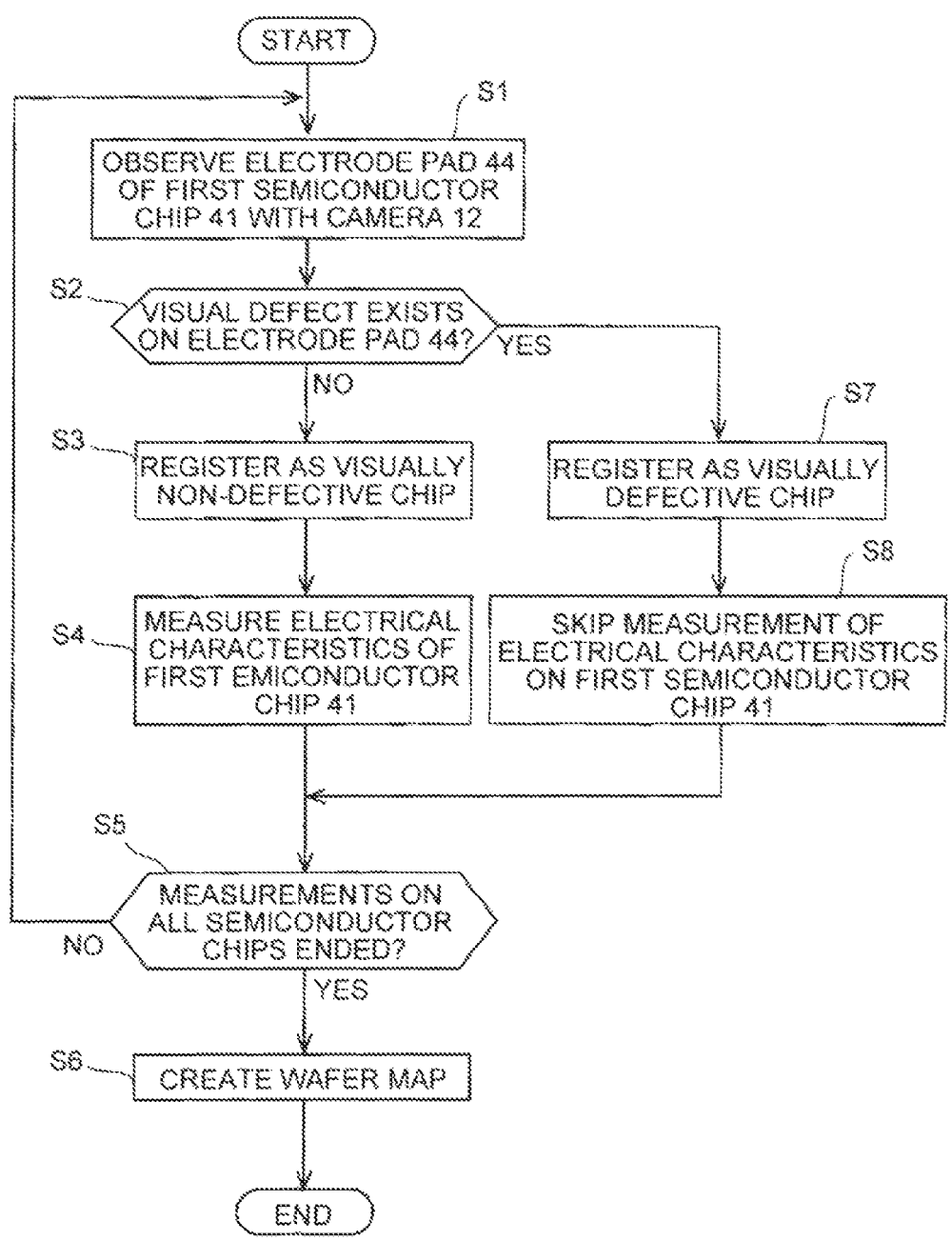
FIG. 4 is a flowchart illustrating a method of inspecting a semiconductor chip according to the first embodiment.
Figure 5:
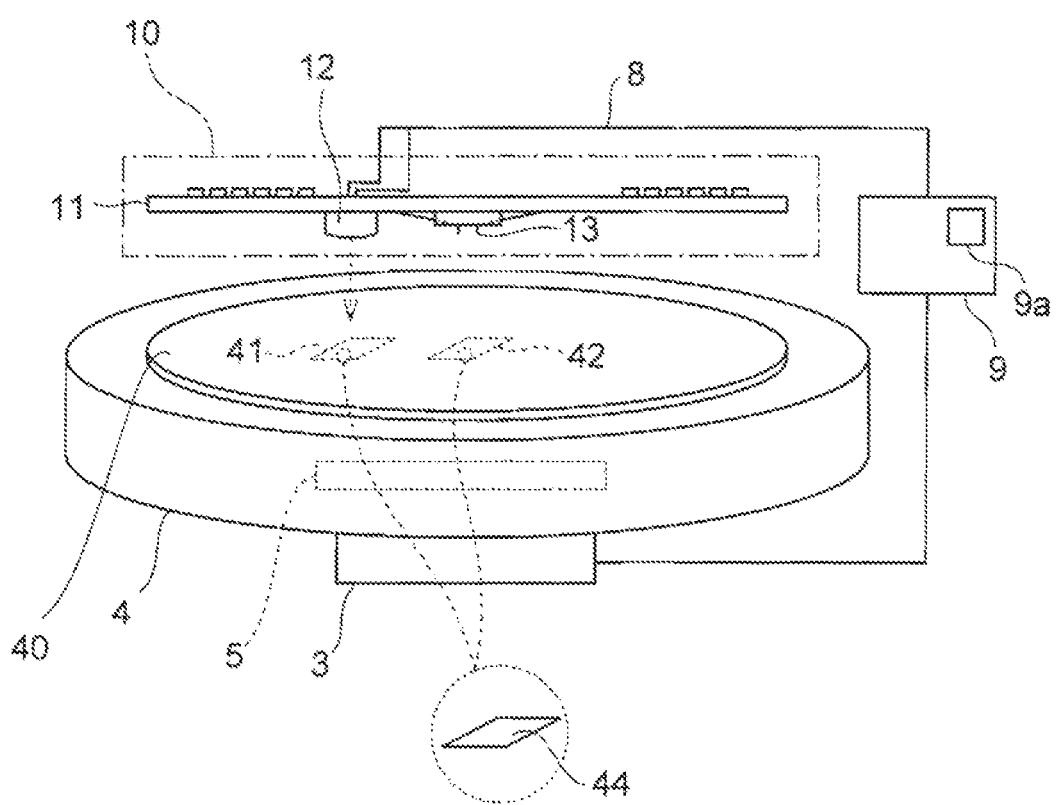
FIG. 5 is a schematic diagram illustrating the method of inspecting a semiconductor chip.
Figure 6:
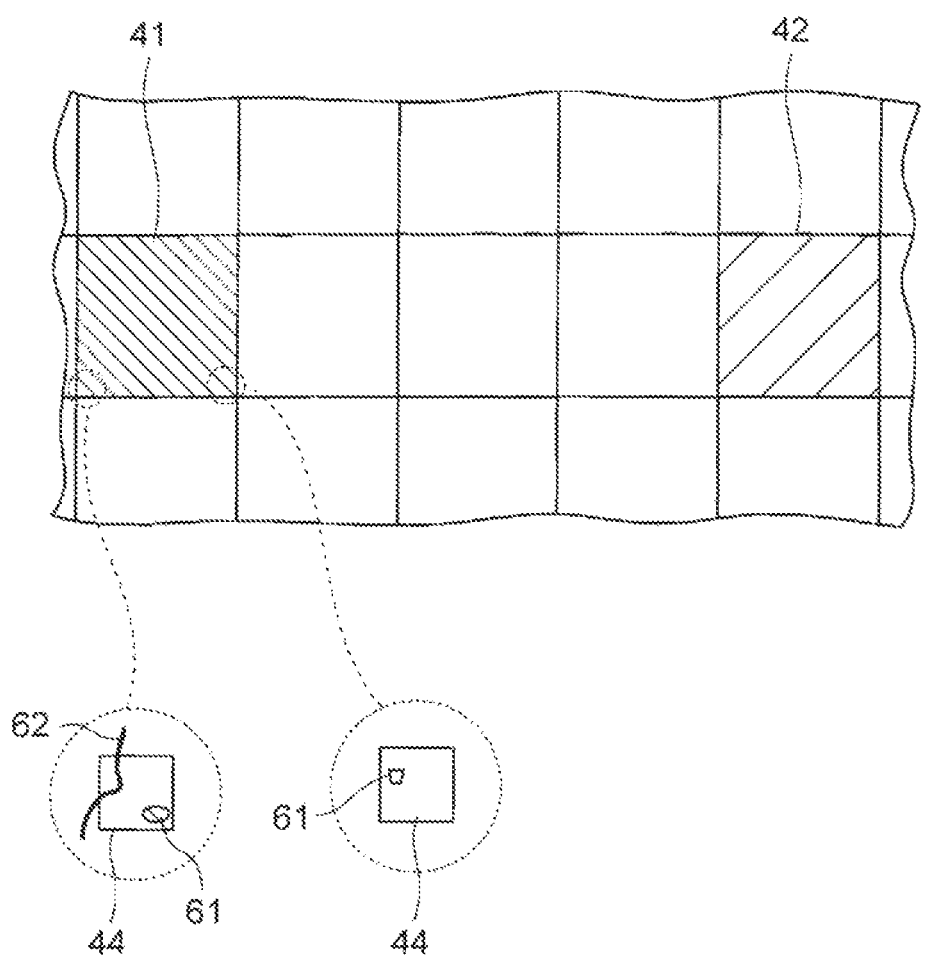
FIG. 6 is a plan view of the measurement wafer during a test in the first embodiment.

FIG. 4 is a flowchart illustrating the method of inspecting a semiconductor chip according to this embodiment. FIG. 5 is a schematic diagram illustrating the method of inspecting a semiconductor chip. FIG. 6 is a plan view of the measurement wafer during a test.

As illustrated in FIG. 5, in this embodiment, when the second semiconductor chip 42 is measured prior to the first semiconductor chip 41 not yet to be measured, the camera 12 is provided at a position where the first semiconductor chip 41 is observable.

First of all, in step S1 in FIG. 4, the electrode pad 44 of the first semiconductor chip 41 is observed with the camera 12. The observation timing is immediately after the test on the second semiconductor chip 42 is ended in a state that the probe 13 is left above the second semiconductor chip 42.

The electrode pad 44 to be observed is particularly not limited. Several representatives among the multiple electrode pads 44 formed on the semiconductor chip 41, or only one electrode pad 44 may be observed.

An image signal from the camera 12 is obtained by such observation of the electrode pad 44, and the obtained image signal is taken in by the controller 9 through the cable 8.

Then, in the following step S2 in FIG. 4, on the basis of the image signal thus taken in, the controller 9 judges whether or not a visual defect exists on the electrode pad 44 of the first semiconductor chip 41.

Examples of such a visual defect include a foreign substance 61 attached to the electrode pad 44, a surface scratch 62, and the like as illustrated in FIG. 6.

Here, if it is judged that a visual defect exists (YES), the method proceeds to step S7 in FIG. 4, and the first semiconductor chip 41 is registered as a visually defective chip in the storage 9a (see FIG. 1).

Subsequently, the method proceeds to step S8, and the measurement of the first semiconductor chip 41 registered as the visually defective chip is thus skipped.

Meanwhile, if it is judged in step S2 that no visual defect exists (NO), the method proceeds to step S3, and the controller 9 registers the first semiconductor chip 41 as a visually non-defective chip in the storage 9a.

Thereafter, the method proceeds to step S4, and a predetermined number of semiconductor chips are measured. After that, when the first semiconductor chip 41 is moved below the probe 13, the stage 4 is elevated under control of the controller 9 to bring the electrode pad 44 of the first semiconductor chip 41 into contact with the probe 13. Then, the electrical characteristics of the first semiconductor chip 41 is measured.

After that, the method proceeds to step S5, and the controller 9 judges whether or not the measurements on all the semiconductor chips formed on the measurement wafer 40 are ended.

Here, if it is judged that the measurements are not ended (NO), step S1 is performed again on a semiconductor chip which has not been observed with the camera 12.

Meanwhile, if it is judged that the measurements are ended (YES), the method proceeds to step S6, and a visual defect map is created. This step is performed by the measurement unit 9 on the basis of the visually defective chip and the visually non-defective chip registered in the storage 9a.

Figure 7:
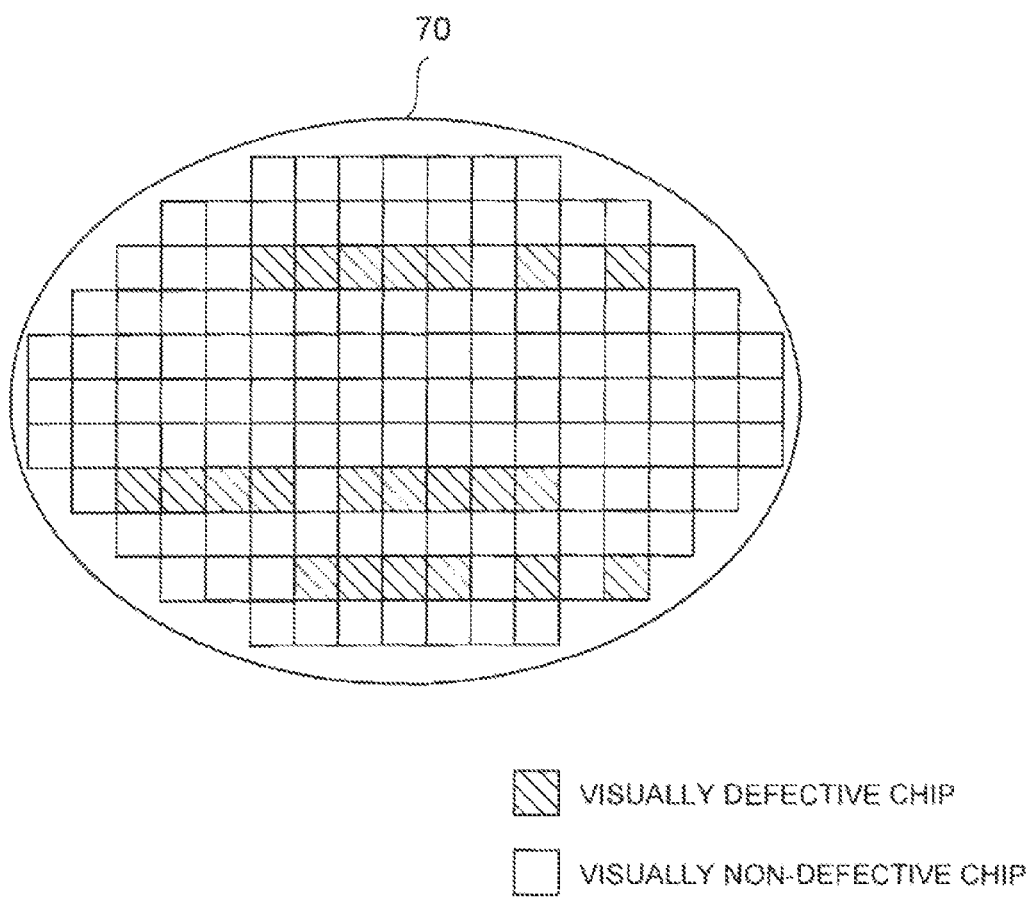
FIG. 7 is a plan view illustrating one example of a visual defect map created in the first embodiment.

FIG. 7 is a plan view illustrating one example of this visual defect map 70.

The visual defect map 70 indicates the positions of the visually defective chip and the visually non-defective chip in the measurement wafer 40.

In this embodiment, the measurement on the semiconductor chip 41 judged as to be visually defective is skipped in step S8. Accordingly, the measurement is performed only on semiconductor chips judged to be visually non-defective.

Thus, the main steps of the method of inspecting a semiconductor chip according to this embodiment are ended.

In this embodiment described above, as illustrated in FIG. 5, when the second semiconductor chip 42 is measured prior to the first semiconductor chip 41, the camera 12 is provided at the position where the first semiconductor chip 41 is observable.

Accordingly, it is not necessary to move the stage 4 over a distance in order to observe the first semiconductor chip 41 with the camera 12, and hence the time spent for moving the stage 4 can be reduced.

Further, the appearance of the first semiconductor chip 41 is observed concurrently with the measurement on the second semiconductor chip 42 as described above. Hence, the step of performing the electrical measurement on the measurement wafer 40 and the step of observing the appearance of the measurement wafer 40 can be performed simultaneously. This can contribute to shortening of the fabricating process for semiconductor devices.

Moreover, when a visual defect is found by the observation, the measurement using the probe 13 is not performed on the semiconductor chip. Thus, deformation of the probe 13 by contact with a foreign substance or the like can be avoided in advance.

Second Embodiment

Figure 8:
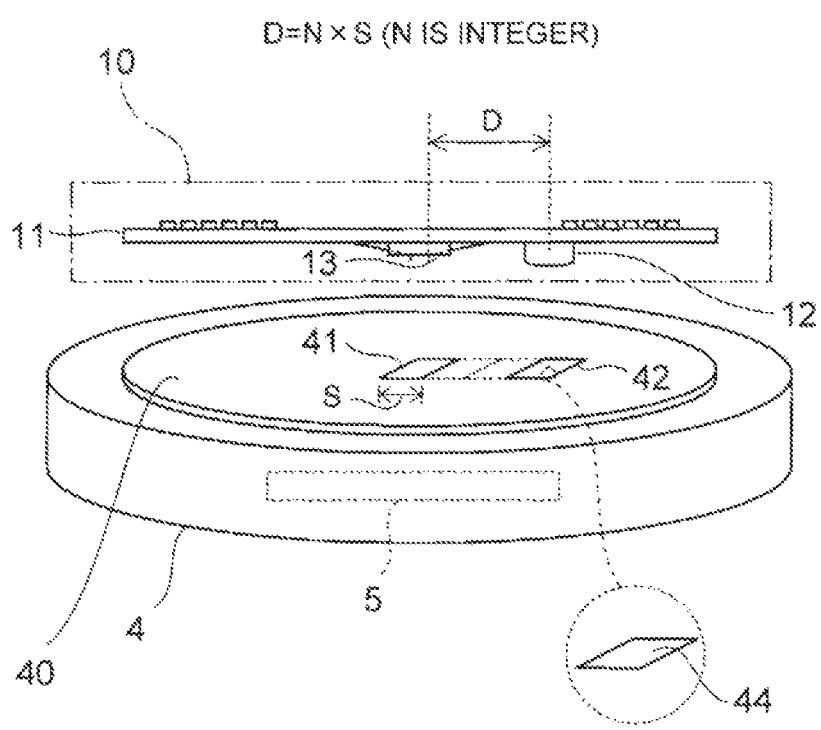
FIG. 8 is a schematic diagram of a testing apparatus according to a second embodiment.

FIG. 8 is a schematic diagram of a testing apparatus according to a second embodiment. Note that, in FIG. 8, the same components as those described in the first embodiment are denoted by the same reference numerals as in the first embodiment, and description thereof is omitted below.

In this embodiment, a distance D between the probe 13 and the center of the FOV of the camera 12 is an integer multiple of a size S of each semiconductor chip (for example, the first semiconductor chip 41) formed on the measurement wafer 40.

In this manner, when the probe card 10 is withdrawn above the first semiconductor chip 41 immediately after the measurement of the first semiconductor chip 41, the electrode pad 44 of the second semiconductor chip 42 comes within the FOV of the camera 12. Thus, it is not necessary to move the stage 4 in order to capture the electrode pad 44 with the camera 12. Thereby, the electrode pad 44 can be observed efficiently by eliminating the moving time of the stage 4.

Incidentally, the sequence of measuring the semiconductor chips 41, 42 with the probe 13 is not limited. The second semiconductor chip 42 before the measurement may be observed with the camera 12, or the second semiconductor chip 42 after the measurement may be measured with the camera 12.

Third Embodiment

Figure 9:
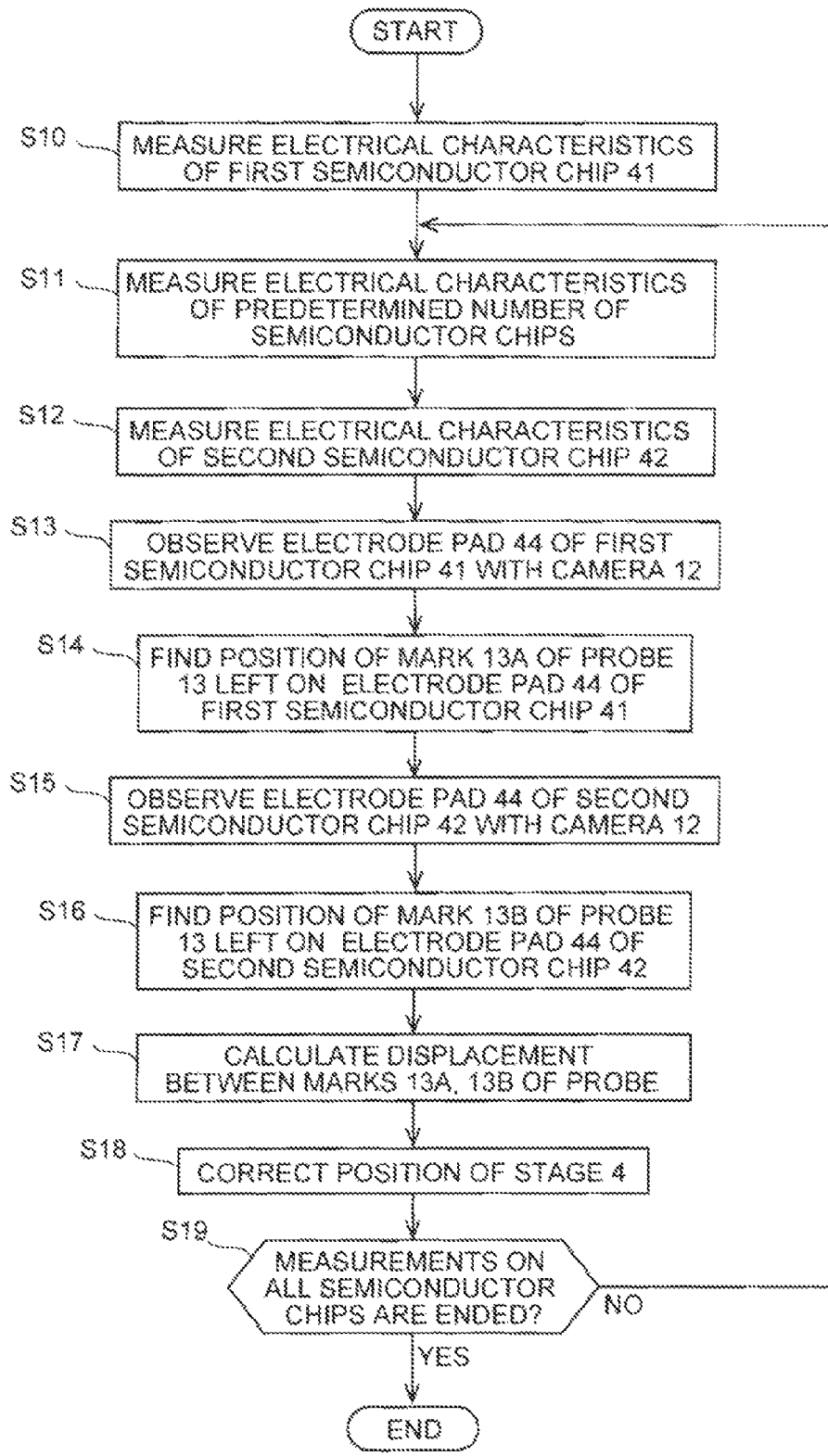
FIG. 9 is a flowchart illustrating a method of inspecting a semiconductor chip according to a third embodiment.

FIG. 9 is a flowchart illustrating a method of inspecting a semiconductor chip according to a third embodiment.

Figure 10:
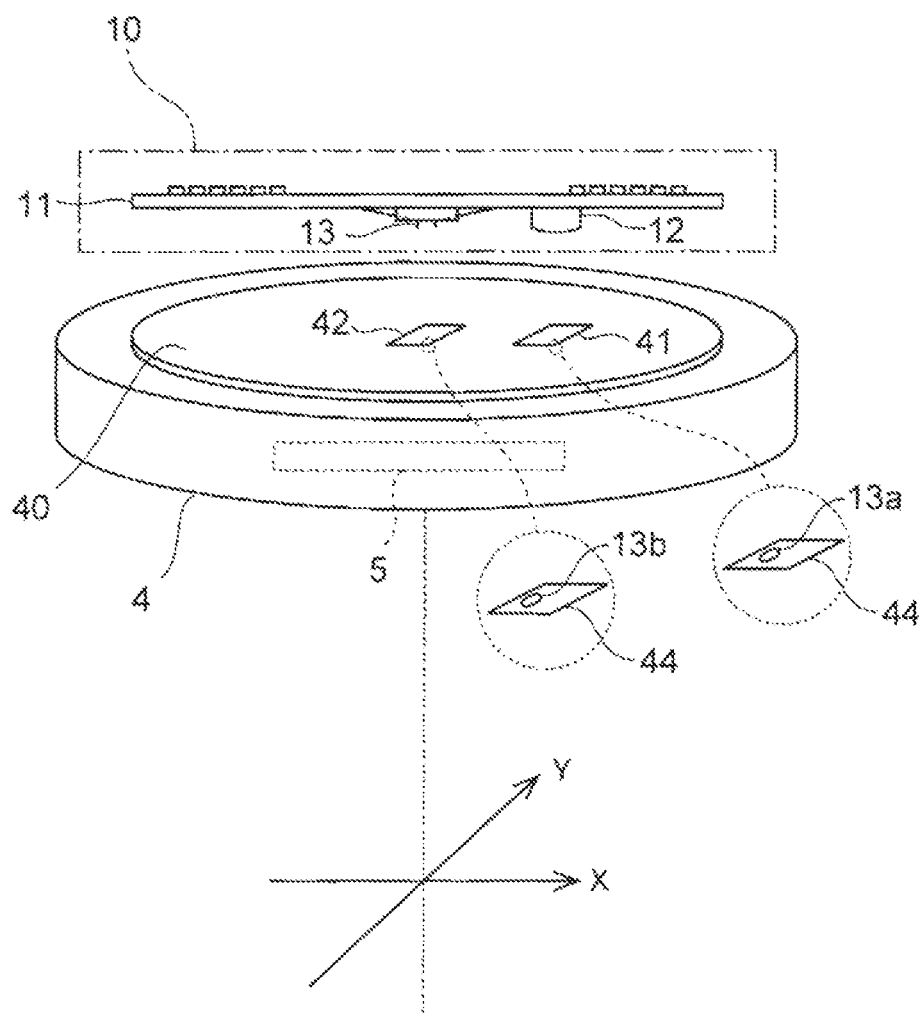
FIG. 10 is a schematic diagram of a testing apparatus according to the third embodiment.

FIG. 10 is a schematic diagram of a testing apparatus according to the third embodiment. Note that, in FIG. 10, the same components as those described in the first embodiment are denoted by the same reference numerals as in the first embodiment, and description thereof is omitted below.

In this embodiment, as illustrated in FIG. 10, when the second semiconductor chip 42 is measured subsequent to the first semiconductor chip 41, the camera 12 is provided at a position to enable an observation of the first semiconductor chip 41 already measured.

First of all, in step S10 in FIG. 9, the stage 4 is elevated under control of the controller 9 to thereby bring the electrode pad 44 of the first semiconductor chip 41 into contact with the probe 13. Then, the electrical characteristics of the first semiconductor chip 41 are measured.

In this event, a mark 13a is left on the electrode pad 44 of the first semiconductor chip 41 by the contact between the electrode pad 44 and the probe 13.

Then, the method proceeds to step S11. The stage 4 is elevated and moved repeatedly to measure the electrical characteristics of a predetermined number of semiconductor chips between the first semiconductor chip 41 and the second semiconductor chip 42.

Subsequently, the method proceeds to step S12. The stage 4 is elevated under control of the controller 9 to thereby bring the electrode pad 44 of the second semiconductor chip 42 into contact with the probe 13, and the electrical characteristics of the second semiconductor chip 42 are measured. Thus, a mark 13b of the probe 13 is left on the surface of the second semiconductor chip 42.

When the measurement is ended, the stage 4 is lowered. In this case, as illustrated in FIG. 10, the electrode pad 44 of the first semiconductor chip 41 is positioned below the camera 12.

Thereafter, the method proceeds to step S13, and the electrode pad 44 of the first semiconductor chip 41 below the camera 12 is observed. Image data thus obtained is acquired by the controller 9.

At this time, the first semiconductor chip 41 is positioned below the camera 12. Accordingly, it is not necessary to move the stage 4 over a distance in order to observe the electrode pad 44 of the semiconductor chip 41 with the camera.

Hence, the state of the probe 13 receiving radiant heat from the stage 4 can be maintained. Accordingly, this makes it possible to prevent the probe 13 from being deformed by the change in temperature during the observation of the electrode pad 44, and to reduce a wasted time for moving the stage 4.

Note that the electrode pad 44 to be observed is not particularly limited. Several representatives among the multiple electrode pads 44 formed on the first semiconductor chip 41 or only one electrode pad 44 may be observed.

Next, the method proceeds to step S14. On the basis of the image data acquired in step S13, the controller 9 finds the position of the mark 13a of the probe 13 left on the electrode pad 44.

Then, the stage 4 is elevated and moved repeatedly to measure the electrical characteristics of a predetermined number of semiconductor chips between the first semiconductor chip 41 and the second semiconductor chip 42.

Subsequently, the method proceeds to step S15. The electrode pad 44 of the second semiconductor chip 42 moved below the camera 12 is observed with the camera 12. Image data on the electrode pad 44 is acquired by the controller 9.

In this event, the second semiconductor chip 42 is positioned below the camera 12. Accordingly, it is not necessary to move the stage 4 over a distance in order to observe the electrode pad 44.

Thus, similarly to the case of step S13 where the first semiconductor chip 41 is observed, the electrode pad 44 can be observed while maintaining a state that the probe 13 receives radiant heat from the stage 4, and the wasted time for moving the stage 4 can also be reduced.

Additionally, the electrode pad 44 to be observed is not particularly limited. However, when several representative electrode pads 44 on the first semiconductor chip 41 are observed in step S13, the same electrode pads 44 are observed in this step also.

Next, the method proceeds to step S16. And on the basis of the image data on the electrode pad 44 acquired in step S15, the controller 9 finds the position of the mark 13b of the probe 13 left on the electrode pad 44 of the second semiconductor chip 42.

Then, the method proceeds to step S17. And the controller 9 calculates a displacement amount between positions of the marks 13a, 13b of the probe 13 acquired in steps S14, S16.

Figure 11:
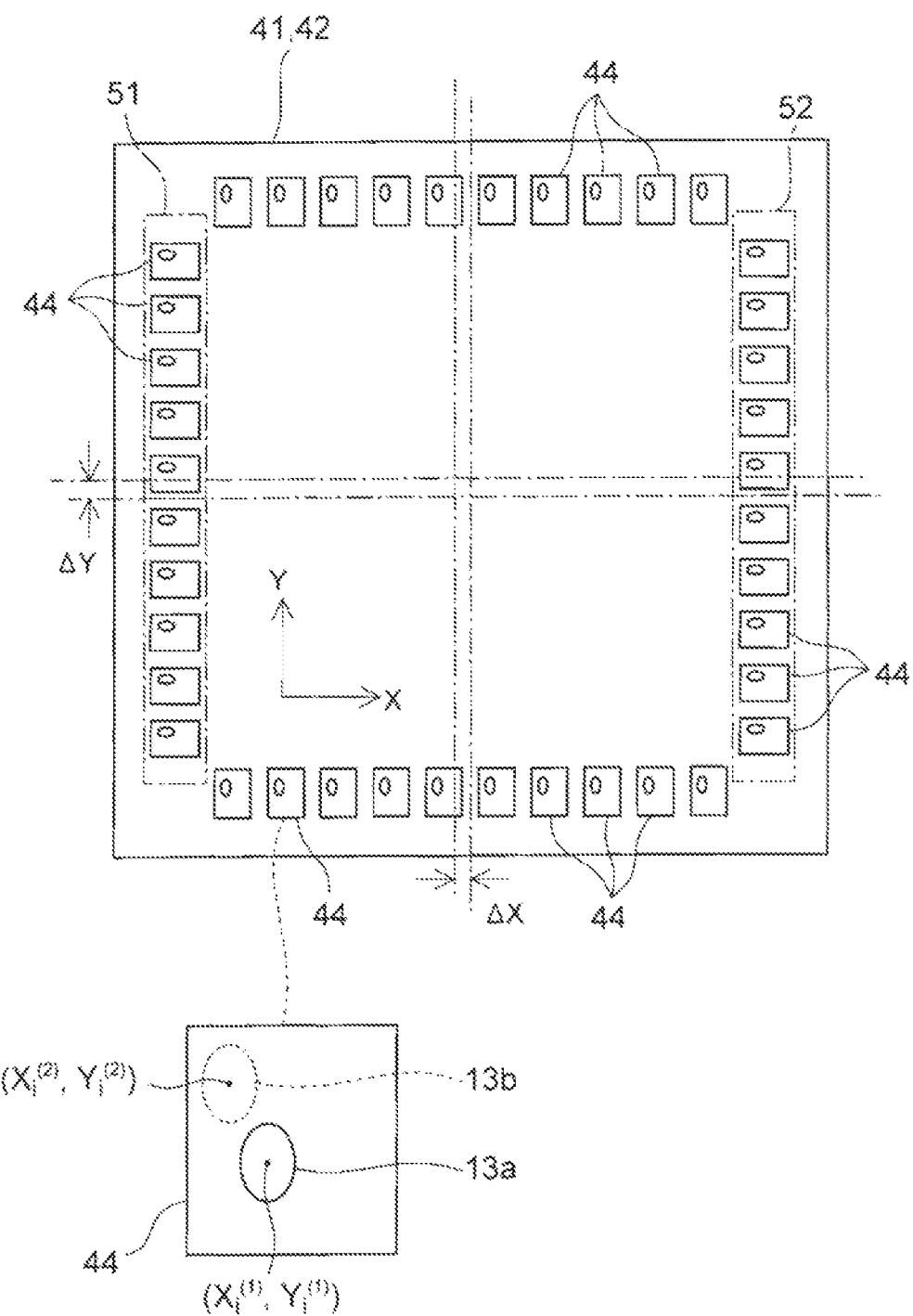
FIG. 11 is a plan view illustrating a method of calculating a displacement between probe marks in the third embodiment.

FIG. 11 is a plan view illustrating a method of calculating an amount of the displacement.

In this example, a case where n (number) electrode pads 44 are present on each semiconductor chip 41, 42 is assumed. Therefore, an X-Y rectangular coordinate system in the chip is arbitrary set such that two adjacent sides of each semiconductor chip 41, 42 respectively serve as an X-axis and a Y-axis.

The position coordinates of the center of a mark 13a left on an i-th electrode pad 44 of the first semiconductor chip 41 are set as $(X_i^{(1)}, Y_i^{(1)})$. The position coordinates of the center of a mark 13b left on an i-th electrode pad 44 of the second semiconductor chip 42 are set as $(X_i^{(2)}, Y_i^{(2)})$.

In this case, the controller 9 calculates a displacement ($\Delta X_i$, $\Delta Y_i$) between the marks 13a, 13b on the i-th electrode pads 44 as in the following formula (1).

$$(\Delta X_i, \Delta Y_i) = (X_i^{(2)} - X_i^{(1)}, Y_i^{(2)} - Y_i^{(1)}) \tag{1}$$

Next, the method proceeds to step S18 in FIG. 9. And the stage 4 is translated and rotated as follows to correct the position of the stage 4 in the horizontal plane.

First, regarding the correction by translation, on the basis of the displacement ($\Delta X_i$, $\Delta Y_i$) above, the controller 9 calculates an average ($\Delta X$, $\Delta Y$) of displacements in the n electrode pads 44 as in the following formula (2).

$$(\Delta X, \Delta Y) = \frac{1}{n}\left(\sum_{i=1}^{n} \Delta X_i, \Delta Y_i\right) \tag{2}$$

$$= \left( \frac{\Delta X_1 + \Delta X_2 + \Lambda + \Delta X_n}{n}, \frac{\Delta Y_1 + \Delta Y_2 + \Lambda + \Delta Y_n}{n} \right)$$

Then, under control of the controller 9, the stage 4 is translated in the horizontal plane by the amount of $(-\Delta X, -\Delta Y)$ which is obtained by reversing the sign of the average $(\Delta X, \Delta Y)$ of the displacements.

Note that instead of taking the average of the displacements $(\Delta X_i, \Delta Y_i)$ of all the n electrode pads 44 as in the formula (2), the average may be taken for several representative electrode pads 44 to simplify the calculation.

For example, since the electrode pad 44 at a corner portion of each semiconductor chip 41, 42 is the farthest from the center of the chip, the displacement $(\Delta X_i, \Delta Y_i)$ between the marks 13a, 13b tends to be larger. Thus, such an electrode pad is suitable for the representative electrode pad 44.

Meanwhile, for the correction by rotation, only pad groups 51, 52 placed opposite to each other are focused among arrays of the electrode pads 44 illustrated in FIG. 11. For each of the pad group 51 on the left and the pad group 52 on the right, the average displacement $\Delta Y_{left}$ or $\Delta Y_{right}$ in the Y direction of the probe marks 13a or 13b is calculated as follows.

$$\Delta Y_{left} = \frac{1}{k}\left(\sum_{i=p}^{p+k} \Delta X_i, \Delta Y_i\right) \tag{3}$$
$$= \left( \frac{\Delta X_p + \Delta X_{p+1} + \Lambda + \Delta X_{p+k}}{k}, \frac{\Delta Y_p + \Delta Y_{p+1} + \Lambda + \Delta Y_{p+k}}{k} \right)$$

$$\Delta Y_{right} = \frac{1}{k}\left(\sum_{i=q}^{q+k} \Delta X_i, \Delta Y_i\right) \tag{4}$$
$$= \left( \frac{\Delta X_q + \Delta X_{q+1} + \Lambda + \Delta X_{q+k}}{k}, \frac{\Delta Y_q + \Delta Y_{q+1} + \Lambda + \Delta Y_{q+k}}{k} \right)$$

Note that in the formulae (3), (4), a case is assumed where the number of electrode pads 44 each having a subscript starting from p is k in total in the pad group 51 on the left, and where the number of electrode pads 44 each having a subscript starting from q is k in total in the pad group 52 on the right.

Note that this embodiment is not limited thereto. Instead of taking the average of all the k electrode pads 44 as in the formulae (3), (4), the average may be taken for representative electrode pads 44 among the k electrode pads 44.

FIG. 12 is a schematic plan view illustrating a method of calculating a correction amount $\Delta\theta$ of rotation for the stage 4 on the basis of the displacements $\Delta Y_{left}$ and $\Delta Y_{right}$ thus obtained.

Note that, in FIG. 12, a length L is a distance between the centers of the pad group 51 on the left and of the pad group 52 on the right. In addition, in this example, as illustrated by the solid lines and the dashed lines within the electrode pads 44, a case is assumed where marks of the probe 13 are shifted by the average displacements $\Delta Y_{left}$, $\Delta Y_{right}$ as described above.

As illustrated in FIG. 12, if rotation displacement occurs by an angle $\Delta\theta$ between the electrode pad 44 and the prober 13 as a whole, the tangent of the angle $\Delta\theta$ can approximate to $(\Delta Y_{left} + \Delta Y_{right})/L$.

Thus, the angle $\Delta\theta$ can be calculated as in the following formula (5).

$$\Delta\theta = \tan^{-1}\left( \frac{\Delta Y_{left} + \Delta Y_{right}}{L} \right) \tag{5}$$

On the basis of the angle $\Delta\theta$ thus calculated, the stage 4 is rotated by the amount of $-\Delta\theta$ under control of the controller 9. Thereby, the position of the stage 4 can be corrected.

In this step, the stage 4 is translated and rotated in the horizontal plane as described above. Thereby, the stage 4 is corrected in a direction such as reducing the average $(\Delta X, \Delta Y)$ of the displacements.

Next, the method proceeds to step S19 in FIG. 9.

In step S19, the controller 9 judges whether or not the measurements of the electrical characteristics on all the semiconductor chips formed on the measurement wafer 40 are ended.

If it is judged that the measurements are not ended (NO), step S11 is performed again on a semiconductor chip whose electrical characteristics have not been measured.

Meanwhile, if it is judged that the measurements are ended (YES), the measurement on this measurement wafer 40 is terminated, and reception of the next measurement wafer is prepared.

Thus, the main steps of the method for inspecting a semiconductor chip according to this embodiment are ended.

In this embodiment described above, when the electrode pad 44 is observed in steps S13, S15, the probe 13 is positioned above the stage 4. Thereby, the probe 13 constantly receives radiant heat from the stage 4 during the observation. This makes it possible to prevent the probe 13 from being deformed by the change in temperature.

Thus, the probe 13 is not deformed during the observation of the electrode pad 44 and during the measurement on each semiconductor chip 41, 42. The thermal deformation of the probe 13 can be eliminated from the factors of displacement between the marks 13a, 13b of the probe 13 left on the electrode pads 44 during the measurement.

This allows precise correction for the displacement between the stage 4 and the probe 13 on the basis of these marks 13a, 13b in step S18. Thereby, it is possible to suppress the displacement risk between the electrode pad 44 and the probe 13 after the correction. As a result, cracks can be prevented from being generated in the passivation film 46 by contact of the tip of the probe 13 and the passivation film 46 around the electrode pad 44. Hence, the reliability of semiconductor chips can be retained.

Furthermore, in step S17, the mark 13a left on the first semiconductor chip 41 measured earlier on a single measurement wafer 40 is used as a measurement reference for the displacement between the marks of the probe 13. Hence, even if the probe 13 is deformed by measuring multiple semiconductor chips continuously after the first semiconductor chip 41, a risk of missing the displacement between the electrode pad 44 and the probe 13 caused by the deformation is reduced.

Fourth Embodiment

Figure 13:
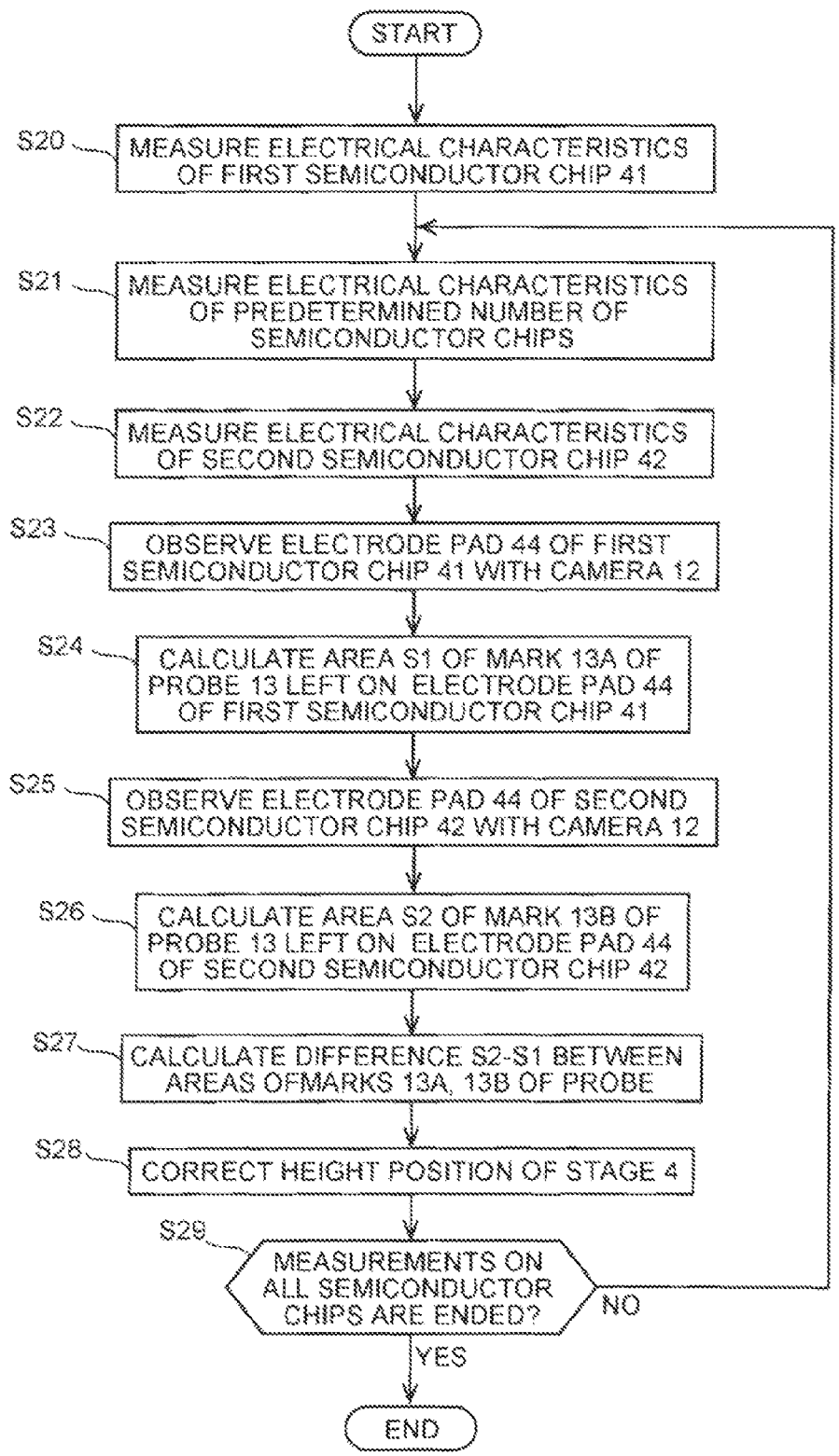
FIG. 13 is a flowchart illustrating a method of inspecting a semiconductor chip according to a fourth embodiment.

FIG. 13 is a flowchart illustrating a method of inspecting a semiconductor chip according to this embodiment.

Figure 14:
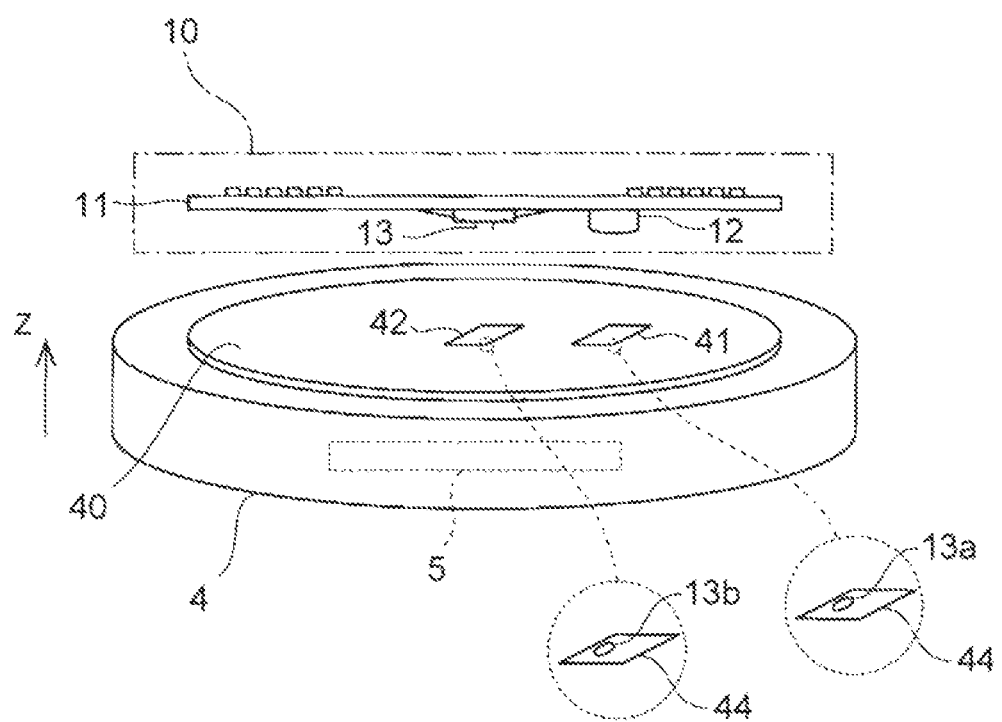
FIG. 14 is a schematic diagram of a testing apparatus according to the fourth embodiment.

FIG. 14 is a schematic diagram of a testing apparatus according to the fourth embodiment. Note that, in FIG. 14, the same components as those described in the first embodiment are denoted by the same reference numerals as in the first embodiment, and description thereof is omitted below.

In this embodiment also, as in the third embodiment, the camera 12 is provided at a position where the first semiconductor chip 41 already measured is observable at the time of measuring the second semiconductor chip 42 after the first semiconductor chip 41.

In step S20 which is the first step in FIG. 13, the stage 4 is elevated under control of the controller 9 to thereby bring the electrode pad 44 of the first semiconductor chip 41 into contact with the probe 13, and the electrical characteristics of the first semiconductor chip 41 are measured.

For the reason why the electrode pad 44 is brought into contact with the probe 13 in this manner, the mark 13a of the probe 13 is left on the electrode pad 44.

Then, the method proceeds to step S21. And the stage 4 is elevated and moved repeatedly to measure the electrical characteristics of a predetermined number of semiconductor chips between the first semiconductor chip 41 and the second semiconductor chip 42.

Subsequently, the method proceeds to Step S22. And the stage 4 is elevated under control of the controller 9 to thereby bring the electrode pad 44 of the second semiconductor chip 42 into contact with the probe 13, and the electrical characteristics of the second semiconductor chip 42 are measured. When the measurement is ended, the stage 4 is lowered. At this time, the electrode pad 44 of the first semiconductor chip 41 is positioned below the camera 12.

Thereafter, the method proceeds to step S23, and the electrode pad 44 of the first semiconductor chip 41 is observed with the camera 12. Image data thus obtained is acquired by the controller 9.

Note that the electrode pad 44 to be observed is not particularly limited. For example, several representatives may be observed among the multiple electrode pads 44 formed on the first semiconductor chip 41. Alternatively, only one electrode pad 44 may be observed.

Next, the method proceeds to step S24, and on the basis of the image data acquired in step S23, the controller 9 calculates an area S1 of the mark 13a of the probe 13 left on the electrode pad 44.

Then, the stage 4 is elevated and moved repeatedly to measure the electrical characteristics of a predetermined number of semiconductor chips.

Subsequently, the method proceeds to step S25. And the electrode pad 44 of the second semiconductor chip 42 moved below the camera 12 is observed with the camera 12. The controller 9 acquires image data of the electrode pad 44.

In this event, since the second semiconductor chip 42 is positioned below the camera 12, it is not necessary to move the stage 4 over a distance so as to observe the electrode pad 44. In addition, the electrode pad 44 can be observed while maintaining a state that the probe 13 receives radiant heat from the stage 4.

Additionally, the electrode pad 44 to be observed is not particularly limited. For example, when several representative electrode pads 44 on the first semiconductor chip 41 are observed in step S23, the identical electrode pads 44 are observed in this step also.

Next, the method proceeds to step S26. And on the basis of the image data of the electrode pad 44 acquired in step S25, controller 9 calculates an area S2 of the mark 13b of the probe 13 left on the electrode pad 44 of the second semiconductor chip 42.

Then, the method proceeds to step S27, and the controller 9 calculates a difference S2-S1 between the areas of the marks 13a, 13b of the probe 13 acquired in steps S24, S26.

Here, the areas S1, S2 of the marks 13a, 13b serve as the reference of the height position of the stage 4 during the measurement. The larger the areas, the higher the position of the stage 4 is located so that the probe 13 is pressed stronger against the electrode pad 44.

If the height of the probe 13 does not change with the passage of time or the like between steps S24 and S26, the difference S2-S1 between the areas S1, S2 measured at a time interval should be 0.

In contrast, in the case that the difference S2-S1 is not 0, it can be estimated that the height of the probe 13 has changed with the passage of time or the like.

Thus, in the next step S28, the height position of the stage 4 is corrected in a direction such that the difference S2-S1 between the areas approaches zero.

The correction is performed under control of the controller 9. For example, if the difference S2-S1 exceeds a predetermined positive value $S_{max}$, the stage 4 is lowered by a predetermined negative amount $-\Delta Z$. If the difference S2-S1 is smaller than a predetermined negative value $-S_{min}$, the stage 4 is elevated by a predetermined positive amount $\Delta Z$.

FIG. 15A is an enlarged plan view of the electrode pad 44 before the height position of the stage 4 is corrected, and FIG. 15B is an enlarged plan view of the electrode pad 44 after the correction.

In this example, the height position of the stage 4 is elevated by the correction. Thus, the area of the mark 13a of the probe 13 left on the electrode pad 44 before the correction (FIG. 15A) is larger than that after the correction (FIG. 15B).

Note that when the multiple electrode pads 44 are observed in steps S23, S25, the correction as described above may be performed in the following way. Specifically, first, the difference S2-S1 is calculated for each pair of the electrode pads 44, these differences are averaged by the number of the electrode pads 44 observed, and the average value is compared with each of the predetermined values $S_{max}$, $-S_{min}$.

Next, the method proceeds to step S29 in FIG. 13, and the controller 9 judges whether or not the measurements of the electrical characteristics on all the semiconductor chips formed on the measurement wafer 40 are ended.

If it is judged that the measurements are not ended (NO), step S21 is performed again on a semiconductor chip whose electrical characteristics have not been measured.

Meanwhile, if it is judged that the measurements are ended (YES), the measurement on this measurement wafer 40 is ended, and reception of the next measurement wafer is prepared.

Thus, the main steps of the method of inspecting a semiconductor chip according to this embodiment are ended.

According to this embodiment as described above, even if the height of the probe 13 change with the passage of time or the like, the height of the stage 4 can be corrected as described above by utilizing the areas of the marks 13a, 13b of the probe 13 left on the electrode pads 44. This makes it possible to prevent the probe 13 from being deformed by being excessively pressed against the electrode pad 44, or to prevent insufficient electrical contact between the electrode pad 44 and the probe 13, which is caused due to insufficient contact force therebetween.

Moreover, as in the third embodiment, in this embodiment also, when the electrode pad 44 is observed, the camera 12 is positioned above each of the chips 41, 42. Accordingly, it is not necessary to move the stage 4 for the observation. Hence, a wasted time spent for moving the stage 4 is eliminated. And the probe 13 can constantly receive radiant heat from the stage 4 during the observation. Thereby it is possible to prevent the probe 13 from being deformed by the change in temperature.

Fifth Embodiment

Figure 16:
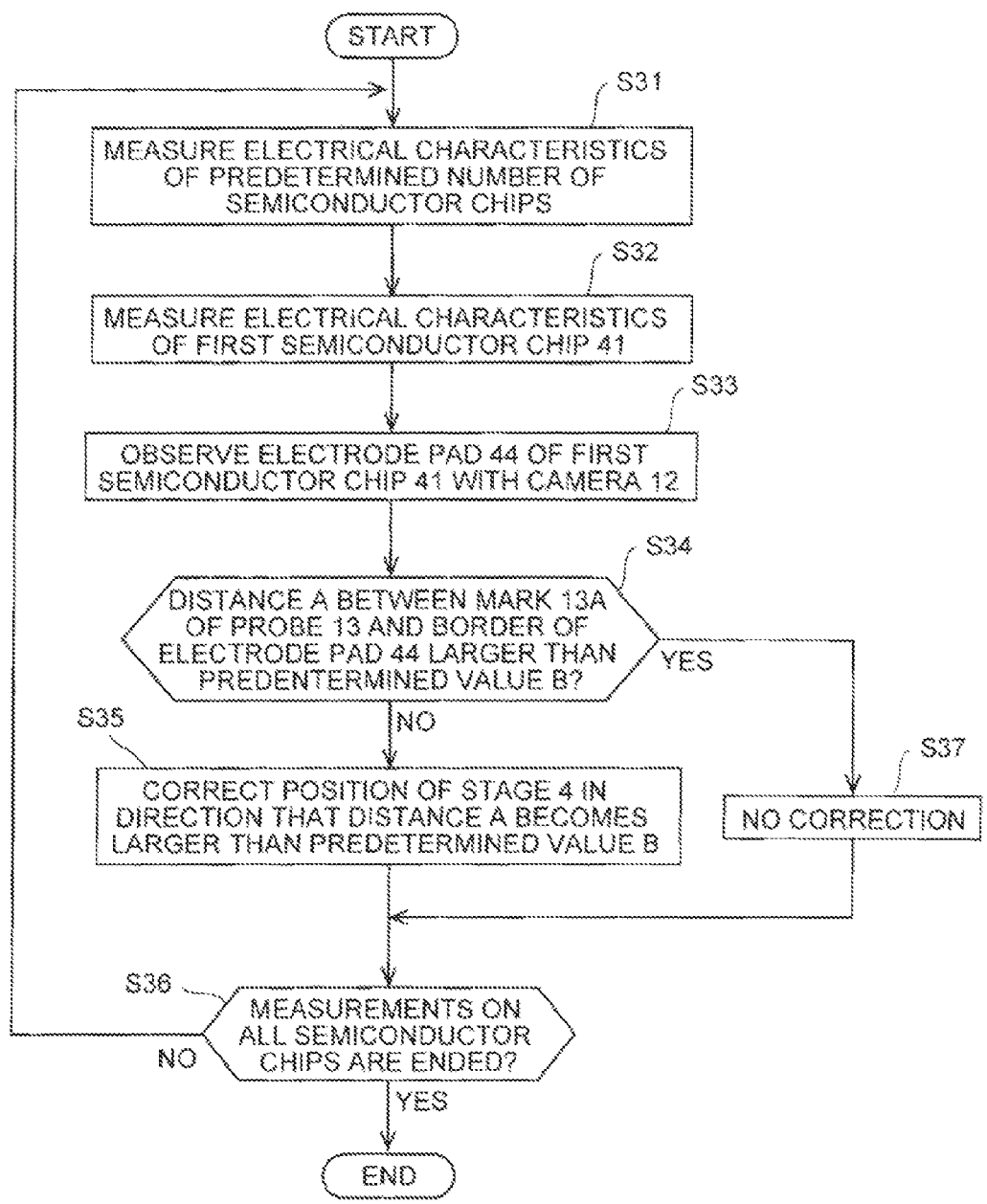
FIG. 16 is a flowchart illustrating a method of inspecting a semiconductor chip according to a fifth embodiment.

FIG. 16 is a flowchart indicating a method of inspecting a semiconductor chip according to this embodiment.

Note that the configuration of a testing apparatus is the same as that in FIG. 10 described in the third embodiment, and thus description thereof is omitted below.

Figure 17:
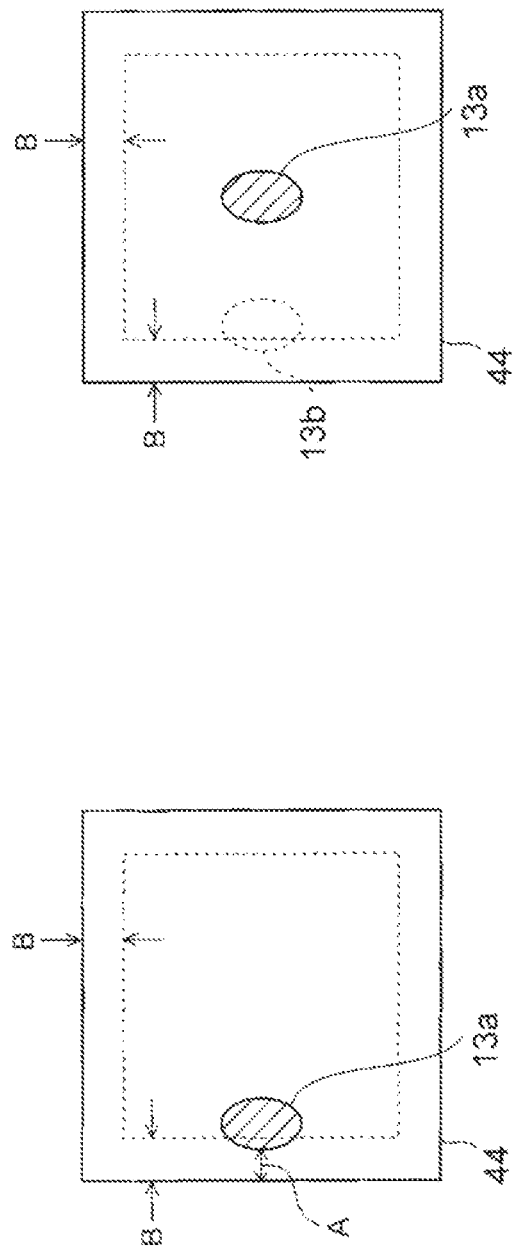
FIGS. 17A, 17B are schematic plan views illustrating the method of inspecting a semiconductor chip according to the fifth embodiment.

FIGS. 17A, 17B are schematic plan views illustrating the method of inspecting a semiconductor chip according to this embodiment. In FIGS. 17A, 17B, the same components as those described in the first embodiment are denoted by the same reference numerals as in the first embodiment, and description thereof is omitted below.

In step S31 which is the first step in FIG. 16, the stage 4 is elevated and moved repeatedly under control of the controller 9 to measure the electrical characteristics of a predetermined number of semiconductor chips.

Then, the method proceeds to Step S32. And the stage 4 is elevated under control of the controller 9 to thereby bring the electrode pad 44 of the first semiconductor chip 41 into contact with the probe 13, and the electrical characteristics of the first semiconductor chip 41 are measured.

After the predetermined number of semiconductor chips are measured, the method proceeds to step S33. And the electrode pad 44 of the first semiconductor chip 41 moved below the camera 12 is observed with the camera 12. The controller 9 takes in image data of the electrode pad 44.

Note that the electrode pad 44 to be observed is not particularly limited. For example, only several representatives may be observed among the multiple electrode pads 44 formed on the semiconductor chip 41. Alternatively, only one electrode pad 44 may be observed.

Next, the method proceeds to step S34.

In this step, as illustrated in FIG. 17A, on the basis of the image data, the controller 9 judges whether or not a distance A between the mark 13a of the probe 13 left on the electrode pad 44 and a contour of the electrode pad 44 is larger than a predetermined value B.

The predetermined value B is not particularly limited, but is, for example, approximately 5 μm.

If it is judged that the distance A is not larger than the predetermined value B (NO), the method proceeds to step S35, and the position of the stage 4 is corrected in a direction such that the distance A becomes larger than the predetermined value B. The correction is performed under control of the controller 9 by translating or rotating the stage 4 in the horizontal plane.

As a result of such a correction, in the measurement on the second semiconductor chip 42 performed after the measurement on the first semiconductor chip 41, the mark 13b of the probe 13 is left closer to the center of the electrode pad 44 as illustrated in FIG. 17B.

Meanwhile, if it is judged that the distance A is larger than the predetermined value B (YES) in step S34, the method proceeds to step S37, and no correction is performed on the stage 4.

Subsequently, the method proceeds to step S36. And the controller 9 judges whether or not the measurements of the electrical characteristics on all the semiconductor chips formed on the measurement wafer 40 are ended.

If it is judged that the measurements are not ended (NO), step S31 is performed again on a semiconductor chip whose electrical characteristics have not been measured.

Meanwhile, if it is judged that the measurements are ended (YES), the measurement on this measurement wafer 40 is ended, and reception of the next measurement wafer is prepared.

Thus, the main steps of the method of inspecting a semiconductor chip according to this embodiment are ended.

According to this embodiment as described above, if the distance A between the contour of the electrode pad 44 and the mark 13a is smaller than the predetermined value B as illustrated in FIG. 17A, the stage 4 is corrected in a manner such that the distance A becomes larger than the predetermined value B.

Thereby, even when the position where the probe 13 comes into contact with the electrode pad 44 gradually shifts from the center of the electrode pad 44 due to change with the passage of time, the stage 4 can be corrected before the contact position reaches the contour of the electrode pad 44. This can reduce a risk that the probe 13 misses the electrode pad 44 and contacts the passivation film 46, and can prevent cracks from being generated in the passivation film 46 by contact of the passivation film 46 and the probe 13.

Furthermore, in step S33, when the electrode pad 44 is observed with the camera 12, the camera 12 is positioned above the first semiconductor chip 41. Accordingly, it is not necessary to move the stage 4 over a distance for the observation. Hence, the time for the movement is eliminated. In addition, the state that the probe 13 receives radiant heat from the stage 4 can be maintained. Thereby it is possible to prevent the probe 13 from being deformed by the change in temperature.

Sixth Embodiment

Figure 18:
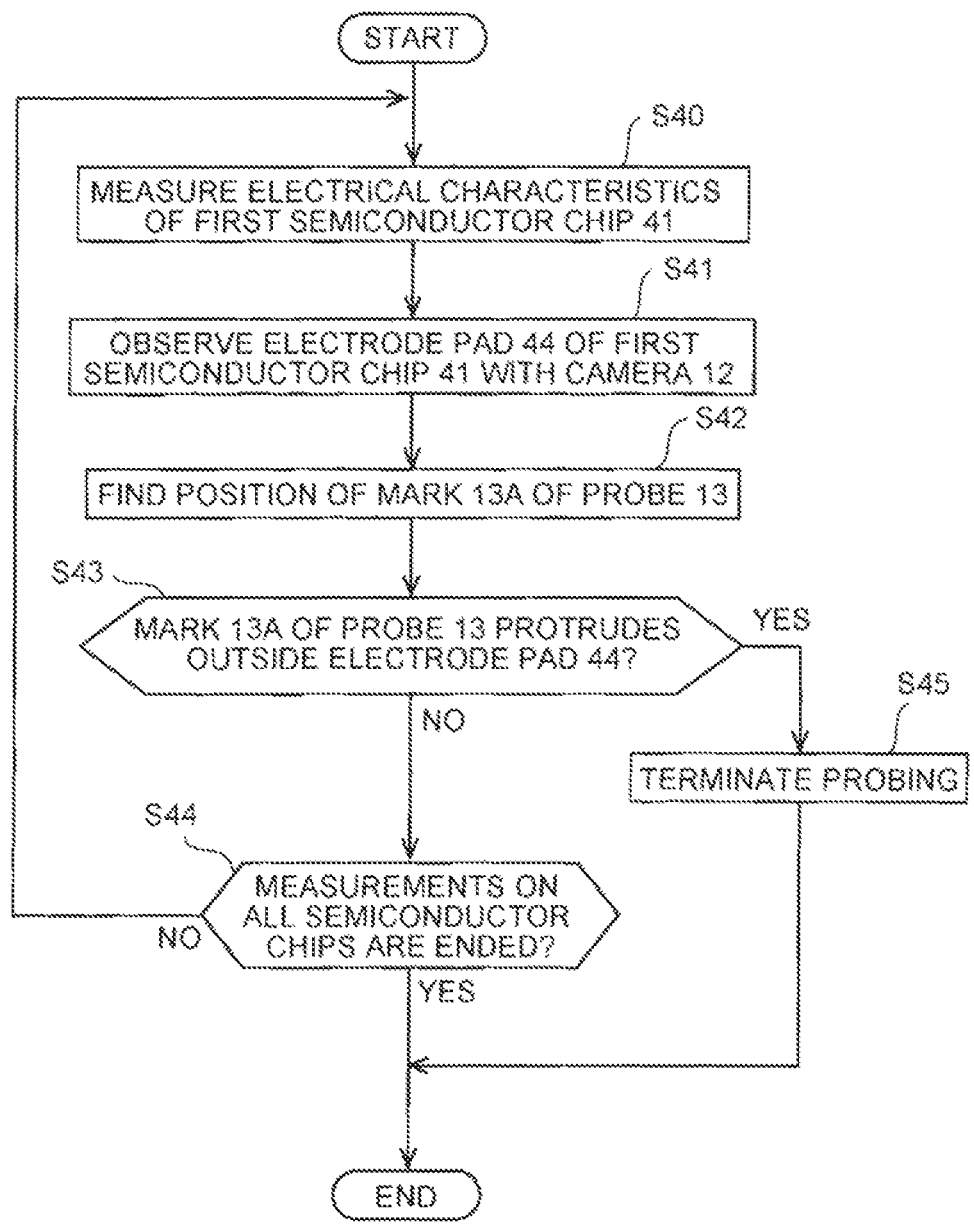
FIG. 18 is a flowchart illustrating a method of inspecting a semiconductor chip according to a sixth embodiment.

FIG. 18 is a flowchart illustrating a method of inspecting a semiconductor chip according to this embodiment.

Note that the configuration of a testing apparatus is the same as that in FIG. 10 described in the third embodiment, and thus description thereof is omitted below.

Figure 19:
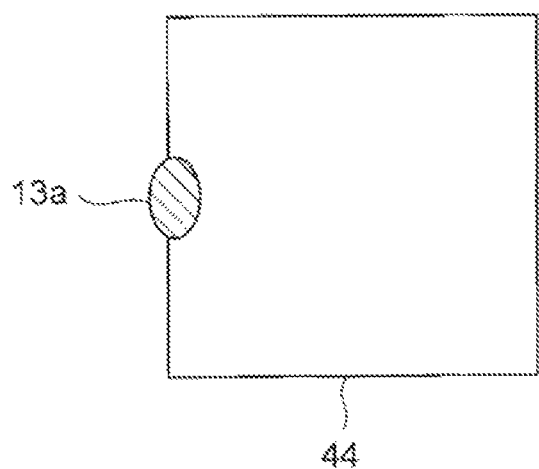
FIG. 19 is an enlarged plan view of an electrode pad during a test in the sixth embodiment.

FIG. 19 is an enlarged plan view of the electrode pad 44 during a test in this embodiment.

First of all, in step S40 in FIG. 18, the electrical characteristics of the first semiconductor chip 41, which is one of multiple semiconductor chips in the measurement wafer 40, are measured under control of the controller 9.

Then, a predetermined number of the semiconductor chips are measured. When the first semiconductor chip 41 is moved below the camera 12, the method proceeds to step S41, and the electrode pad 44 of the first semiconductor chip 41 is observed with the camera 12. An image signal obtained by this observation is taken in by the controller 9.

In this step, the electrode pad 44 to be observed is not particularly limited. For example, only several representatives may be observed among the multiple electrode pads 44 formed on the semiconductor chip 41, or only one electrode pad 44 may be observed.

Next, the method proceeds to step S42. And on the basis of the image signal outputted from the camera 12, the controller 9 finds the position of the mark 13a of the probe 13 (see FIG. 19).

Subsequently, the method proceeds to step S43. And the controller 9 judges whether or not the mark 13a protrudes outside the electrode pad 44 as illustrated in FIG. 19.

If it is judged that the mark 13a protrudes outside the electrode pad 44 (YES), the method proceeds to step S45. And the controller 9 determines to abort the measurements on other semiconductor chips performed after the measurement on the first semiconductor chip 41.

Meanwhile, if it is judged that the mark 13a does not protrude outside the electrode pad 44 (NO), the method proceeds to step S44. The controller 9 judges whether or not the measurements of the electrical characteristics on all the semiconductor chips formed on the measurement wafer 40 are ended.

If it is judged that the measurements are not ended (NO), step S40 is performed again on a semiconductor chip whose electrical properties have not been measured.

Meanwhile, if it is judged that the measurements are ended (YES), the measurement on this measurement wafer 40 is ended, and reception of the next measurement wafer is prepared.

Thus, the main steps of the method of inspecting a semiconductor chip according to this embodiment are ended.

According to this embodiment as described above, if it is judged that the mark 13a of the probe 13 protrudes outside the electrode pad 44 in step S43, the method proceeds to tep S45, and the subsequent measurement is aborted.

As the cause that the mark 13a protrudes outside the electrode pad 44, for example, there is a case where the probe 13 is excessively deformed by stepping on a foreign substance on the electrode pad 44. In that case, merely correcting the position of the stage 4 cannot correctly bring the electrode pad 44 into contact with the probe 13.

In such a case, the abort of the measurement as described above can lead to preventing the deformed probe 13 from protruding outside the electrode pad 44 of the subsequent semiconductor chip and thereby contacting the passivation film 46. Hence, a reduction in yield of semiconductor chips due to a damage on the passivation film 46 can be suppressed.

Seventh Embodiment

Figure 20:
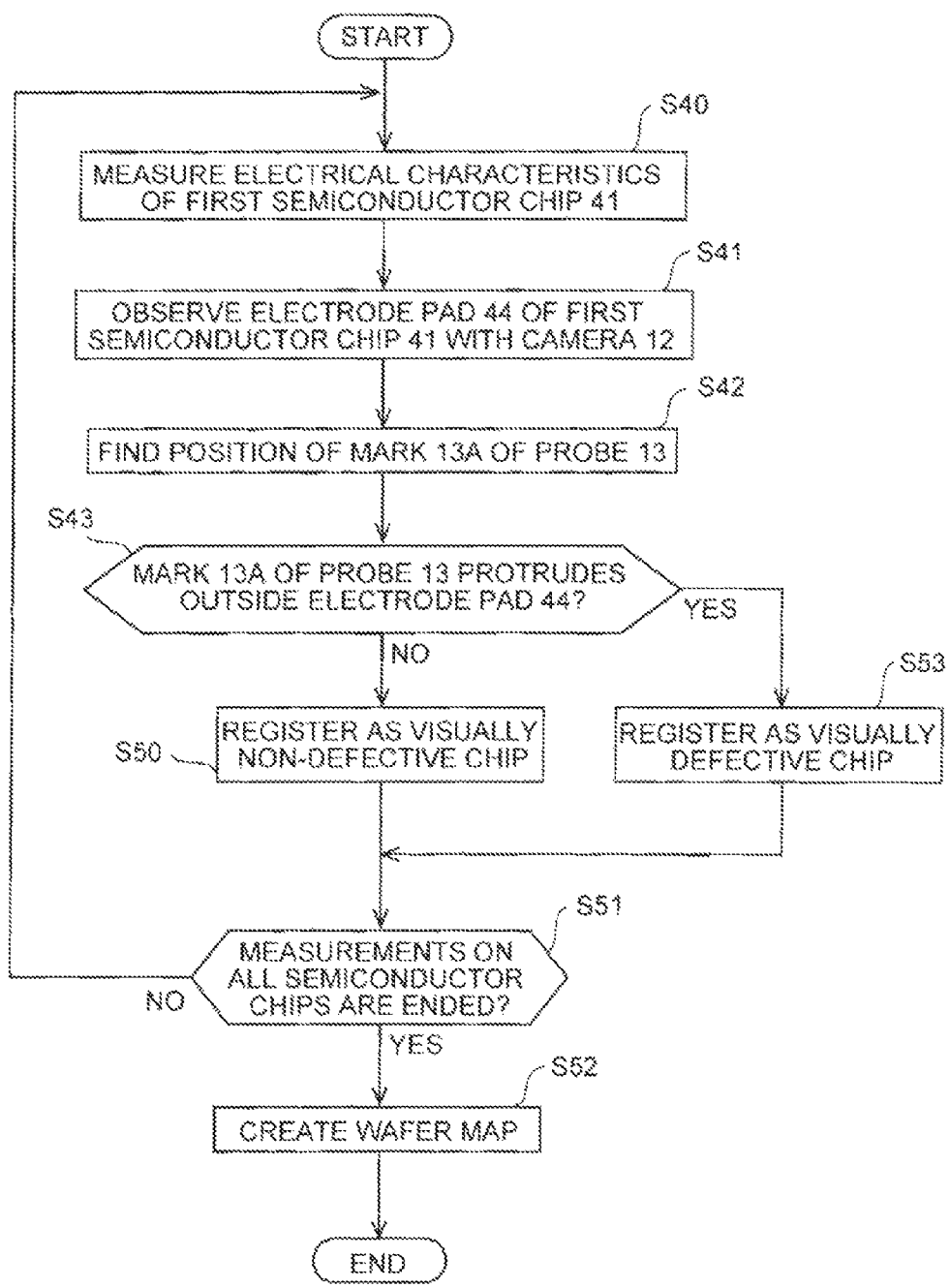
FIG. 20 is a flowchart illustrating a method of inspecting a semiconductor chip according to a seventh embodiment.

FIG. 20 is a flowchart illustrating a method of inspecting a semiconductor chip according to this embodiment.

This embodiment is the same as the sixth embodiment from steps S40 to S43, but differs from the sixth embodiment in steps after the judgment step of step S43 as follows.

First, in step S43, if the controller 9 judges that the mark 13a does not protrude outside the electrode pad 44 (NO), the method proceeds to step S50. The controller 9 registers the first semiconductor chip 41 as a visually non-defective chip in the storage 9a (see FIG. 1).

Meanwhile, if the controller 9 judges that the mark 13a protrudes outside the electrode pad 44 (YES) in step S43, the method proceeds to step S53. And the controller 9 registers the first semiconductor chip 41 as a visually defective chip in the storage 9a.

Subsequently, the method proceeds to step S51. And the controller 9 judges whether or not the measurements on all the semiconductor chips formed on the measurement wafer 40 are ended.

Here, if it is judged that the measurements are not ended (NO), step S40 is performed again on a semiconductor chip whose electrical properties have not been measured.

Meanwhile, if it is judged that the measurements are ended (YES), the method proceeds to step S52, and a visual defect map is created. This step is performed by the measurement unit 9 on the basis of the visually defective chip and the visually non-defective chip registered in the storage 9a.

Figure 21:
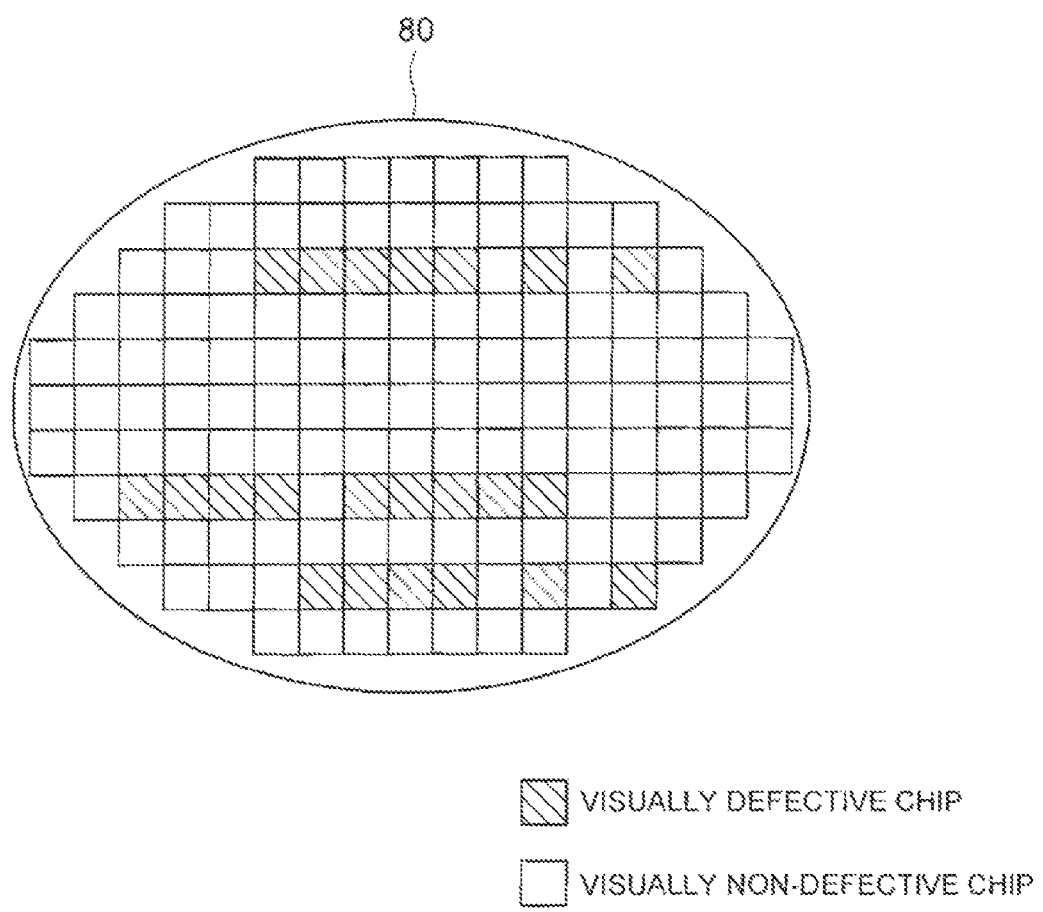
FIG. 21 is a plan view illustrating one example of a visual defect map created in the seventh embodiment.

FIG. 21 is a plan view illustrating one example of this visual defect map 80.

The visual defect map 80 indicates the positions of the visually defective chips and the visually non-defective chips in the measurement wafer 40.

Thus, the main steps of the method of inspecting a semiconductor chip according to this embodiment are ended.

According to this embodiment as described above, concurrently with the measurements on multiple semiconductor chips formed on the measurement wafer 40, the visually defective chip and the visually non-defective chip are discriminated from each other in steps S50, S53.

This can skip a visual inspection process for inspecting the appearance of each semiconductor chip after the measurement of the electrical characteristics on the measurement wafer 40, and can contribute to shortening of the fabricating process for semiconductor devices.

Eighth Embodiment

In this embodiment, description is given with regard to a method of applying the first to the seventh embodiments to an actual mass-production process for semiconductor chips.

Figure 22:
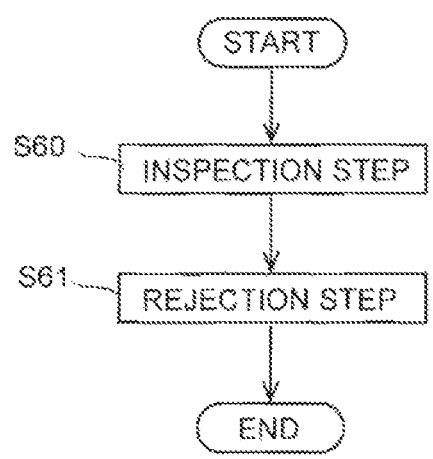
FIG. 22 is a flowchart illustrating a method of inspecting a semiconductor chip according to an eighth embodiment.

FIG. 22 is a flowchart denoting a method of inspecting a semiconductor chip according to this embodiment.

In this embodiment, in an inspection step S60 in FIG. 22, the electrical characteristics of each of multiple semiconductor chips provided on the measurement wafer 40 are inspected. The electrode pad 44 of the semiconductor chip to be inspected is observed with the camera 12 as described in the first to the seventh embodiments.

Then, the method proceeds to a rejection step S61. And a semiconductor chip judged to be defective in the inspection of the electrical characteristics in the inspection step S60 is excluded, and only a semiconductor chip judged to be non-defective is left remained.

Thus, the main steps of the method of inspecting a semiconductor chip according to this embodiment are ended.

When the first to the seventh embodiments are applied to the mass-production process as in this embodiment, thereby the actual mass-production process can benefit the advantage of preventing thermal deformation of the probe 13 during the observation of the electrode pad 44, and so forth.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A prober comprising:
a probe card that includes a support board and a probe attached to the support board;
a stage on which a measurement wafer, that includes a first semiconductor chip and a second semiconductor chip, is mounted;
a camera provided over the probe card to observe an electrode pad of the first semiconductor chip and to find a position of a mark of a probe left on a first electrode pad of the first semiconductor chip, a distance between the probe and a center of a field of view of the camera being an integer multiple of a size of the first semiconductor chip;
a moving unit that moves a position of the stage relative to the probe card; and
a controller that acquires an image signal from the camera and controls the moving unit, that measures an electrical characteristics of the second semiconductor chip by contacting the probe to a second electrode pad of the second semiconductor chip, and that controls the moving unit to correct the position of the stage on the basis of a result of an observation of the mark of the probe left on the first electrode pad with the camera.

2. The prober according to claim 1, wherein the controller finds the position of the mark of the probe left on the basis of the image signal from the camera, after measurement of the first semiconductor chip, brings the probe into contact with the second electrode pad to measure electrical characteristics of the second semiconductor chip, observes the second electrode pad with the camera after measurement of the second semiconductor chip, finds the position of the mark of the probe left on the second electrode pad on the basis of the image signal from the camera, measures a displacement amount between the position of the mark of the probe left on the first electrode pad and the position of the mark of the probe left on the second electrode pad, and corrects the position of the stage in a direction to reduce the displacement amount.

3. The prober according to claim 1, wherein the controller judges whether or not a distance between the mark of the probe and a contour of the electrode pad is larger than a first value on the basis of the image signal from the camera, and corrects the position of the stage in a direction that the distance becomes larger than the first value, if judging that the distance is not larger than the first value.

4. The prober according to claim 1, wherein the controller finds the position of the mark of the probe left on the first electrode pad on the basis of the image signal from the camera, judges whether or not the mark protrudes outside the first electrode pad on the basis of the found position of the mark of the probe, and determines to abort a measurement on another semiconductor chip performed after the measurement on the first semiconductor chip, if judging that the mark protrudes outside the electrode pad.

5. The prober according to claim 1, wherein the controller finds the position of the mark of the probe left on the first electrode pad on the basis of the image signal from the camera, judges whether or not the mark protrudes outside the first electrode pad on the basis of the found position of the mark of the probe, records the first semiconductor chip as a visually defective chip, if judging that the mark protrudes outside the first electrode pad, records the first semiconductor chip as a visually non-defective chip, if judging that the mark does not protrude outside the first electrode pad, and creates a wafer map indicating positions of the recorded visually defective chip and visually non-defective chip in the measurement wafer.

6. The prober according to claim 1, wherein the controller calculates an area of the mark of the probe left on the first electrode pad on the basis of the image signal from the camera, after the first semiconductor chip is measured, brings the probe into contact with the second electrode pad to measure the electrical characteristics of the second semiconductor chip, observes the second electrode pad with the camera after the second semiconductor chip is measured, calculates an area of the mark of the probe left on the second electrode pad on the basis of a result of the observation with the camera, calculates a difference between the area of the mark of the probe left on the first electrode pad and the area of the mark of the probe left on the second electrode pad, and corrects a height position of the stage in a direction that the difference approaches zero.

7. The prober according to claim 1, wherein the controller before the first semiconductor chip is measured, judges whether or not a visual defect exists on the first electrode pad on the basis of the image signal from the camera, records the first semiconductor chip as a visually defective chip, if judging that a visual defect exists on the first electrode pad, records the first semiconductor chip as a visually non-defective chip, if judging that no visual defect exists on the first electrode pad, and creates a wafer map indicating positions of the recorded visually defective chip and visually non-defective chip in the measurement wafer.

* * * * *